(12) United States Patent
Wang et al.

(10) Patent No.: US 11,908,919 B2
(45) Date of Patent: Feb. 20, 2024

(54) MULTI-GATE DEVICES WITH MULTI-LAYER INNER SPACERS AND FABRICATION METHODS THEREOF

(71) Applicant: Taiwan Semiconductor Manufacturing Co., Ltd., Hsin-Chu (TW)

(72) Inventors: Chih-Ching Wang, Kinmen County (TW); Jon-Hsu Ho, New Taipei (TW); Wen-Hsing Hsieh, Hsinchu (TW); Kuan-Lun Cheng, Hsin-Chu (TW); Chung-Wei Wu, Hsin-Chu County (TW); Zhiqiang Wu, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 12 days.

(21) Appl. No.: 17/200,291

(22) Filed: Mar. 12, 2021

(65) Prior Publication Data

US 2021/0376119 A1 Dec. 2, 2021

Related U.S. Application Data

(60) Provisional application No. 63/031,314, filed on May 28, 2020.

(51) Int. Cl.
*H01L 29/66* (2006.01)
*H01L 21/8234* (2006.01)
(Continued)

(52) U.S. Cl.
CPC ............ *H01L 29/66484* (2013.01); *H01L 21/823418* (2013.01); *H01L 21/823431* (2013.01);
(Continued)

(58) Field of Classification Search
CPC ......... H01L 29/66545; H01L 29/66606; H01L 29/66871; H01L 29/513; H01L 21/022;
(Continued)

(56) References Cited

U.S. PATENT DOCUMENTS 10,096,688 B2 * 10/2018 Tak ................. H01L 29/66742
10,164,012 B2 12/2018 Fung et al.
(Continued)

FOREIGN PATENT DOCUMENTS

TW 201735256 A 10/2017
TW 201913754 A 4/2019

*Primary Examiner* — Sonya McCall-Shepard
(74) *Attorney, Agent, or Firm* — HAYNES AND BOONE, LLP

(57) ABSTRACT

A method of manufacturing a semiconductor device includes forming a fin structure in which first semiconductor layers and second semiconductor layers are alternatively stacked; forming a sacrificial gate structure over the fin structure; etching a source/drain (S/D) region of the fin structure, which is not covered by the sacrificial gate structure, thereby forming an S/D space; laterally etching the first semiconductor layers through the S/D space, thereby forming recesses; forming a first insulating layer, in the recesses, on the etched first semiconductor layers; after the first insulating layer is formed, forming a second insulating layer, in the recesses, on the first insulating layer, wherein a dielectric constant of the second insulating layer is less than that of the first insulating layer; and forming an S/D epitaxial layer in the S/D space, wherein the second insulating layer is in contact with the S/D epitaxial layer.

20 Claims, 26 Drawing Sheets

(51) Int. Cl.
  *H01L 29/78* (2006.01)
  *H01L 29/423* (2006.01)
  *H01L 29/49* (2006.01)
  *H01L 29/06* (2006.01)
  *H01L 29/786* (2006.01)

(52) U.S. Cl.
  CPC .. *H01L 29/66553* (2013.01); *H01L 29/66795* (2013.01); *H01L 29/7831* (2013.01); *H01L 29/7848* (2013.01)

(58) Field of Classification Search
  CPC ......... H01L 21/02304; H01L 21/02362; H01L 21/3143–3145; H01L 21/3142; H01L 29/511; H01L 21/02107–02126; H01L 29/0673; H01L 29/42392; H01L 29/66787; H01L 29/78696; H01L 29/0843–0891; H01L 29/66636–66643; H01L 21/823418–823425; H01L 21/823814; H01L 29/7848; H01L 29/66553; H01L 21/823431; H01L 29/66795; H01L 29/7831; H01L 29/4983; H01L 29/66439; H01L 29/6653; H01L 29/6656; H01L 21/28132–2815; H01L 21/823468; H01L 21/823864; H01L 29/66689; H01L 29/66719; H01L 29/51–518; H01L 29/66484; H01L 29/0649; H01L 29/0653
  See application file for complete search history.

(56) References Cited

U.S. PATENT DOCUMENTS

| | | | |
|---|---|---|---|
| 10,361,202 B2* | 7/2019 | Suh | H01L 21/823821 |
| 10,361,278 B2 | 7/2019 | Yang et al. | |
| 10,714,592 B2 | 7/2020 | Cheng et al. | |
| 2006/0138559 A1* | 6/2006 | Lee | H10B 41/40 |
| | | | 257/536 |
| 2017/0110554 A1 | 4/2017 | Tak et al. | |
| 2017/0250261 A1* | 8/2017 | Kim | H01L 29/66439 |
| 2017/0365604 A1 | 12/2017 | Suh et al. | |
| 2018/0358435 A1 | 12/2018 | Mochizuki et al. | |
| 2019/0157414 A1* | 5/2019 | Ando | H01L 21/823864 |
| 2020/0027959 A1 | 1/2020 | Cheng et al. | |
| 2020/0105929 A1 | 4/2020 | Zhang et al. | |
| 2020/0403073 A1* | 12/2020 | Mihara | H01L 29/7851 |

* cited by examiner

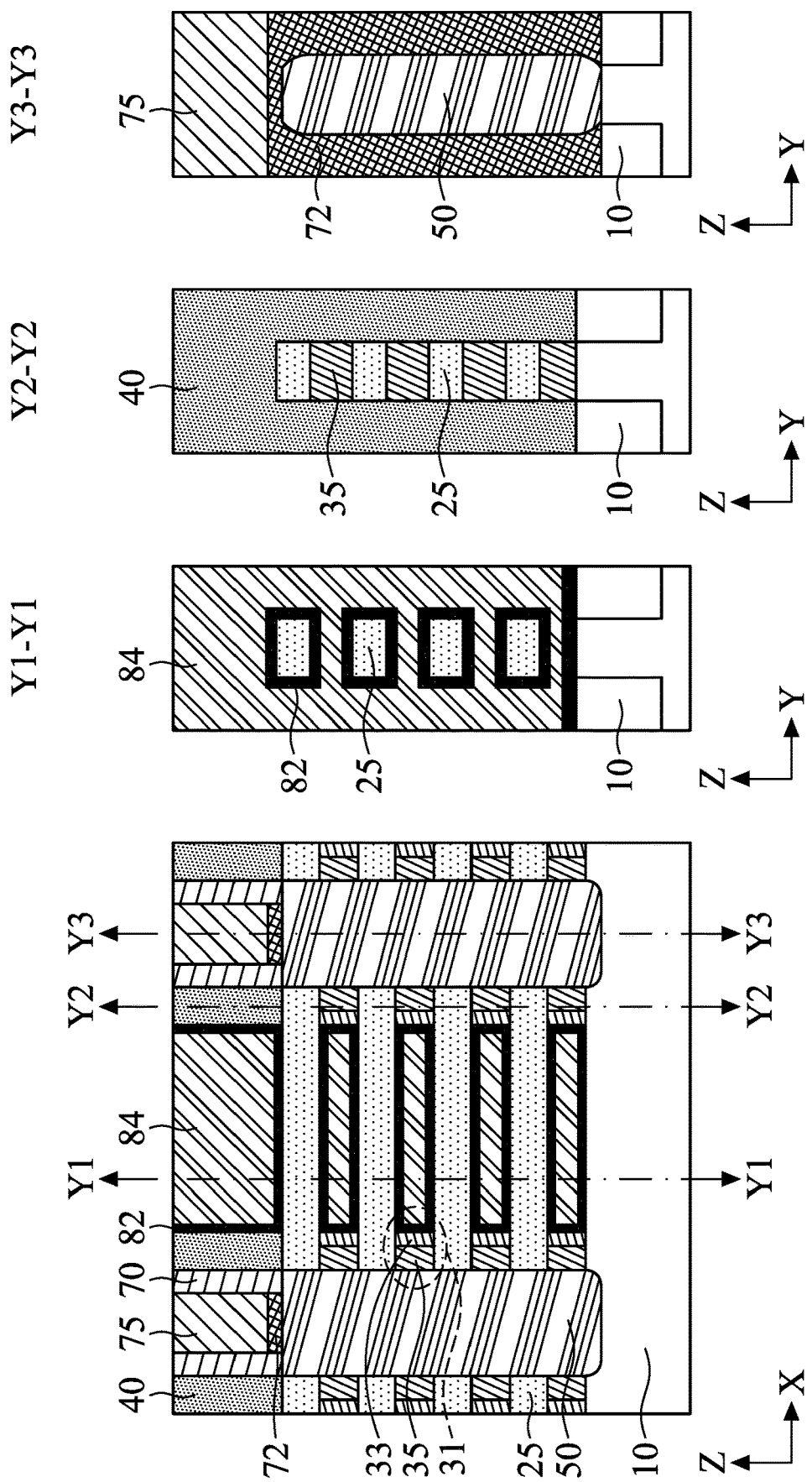

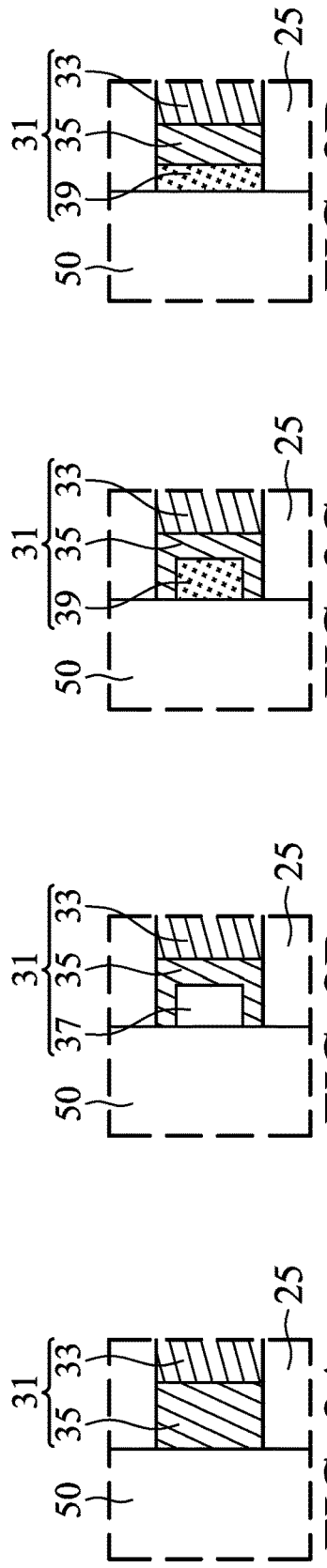

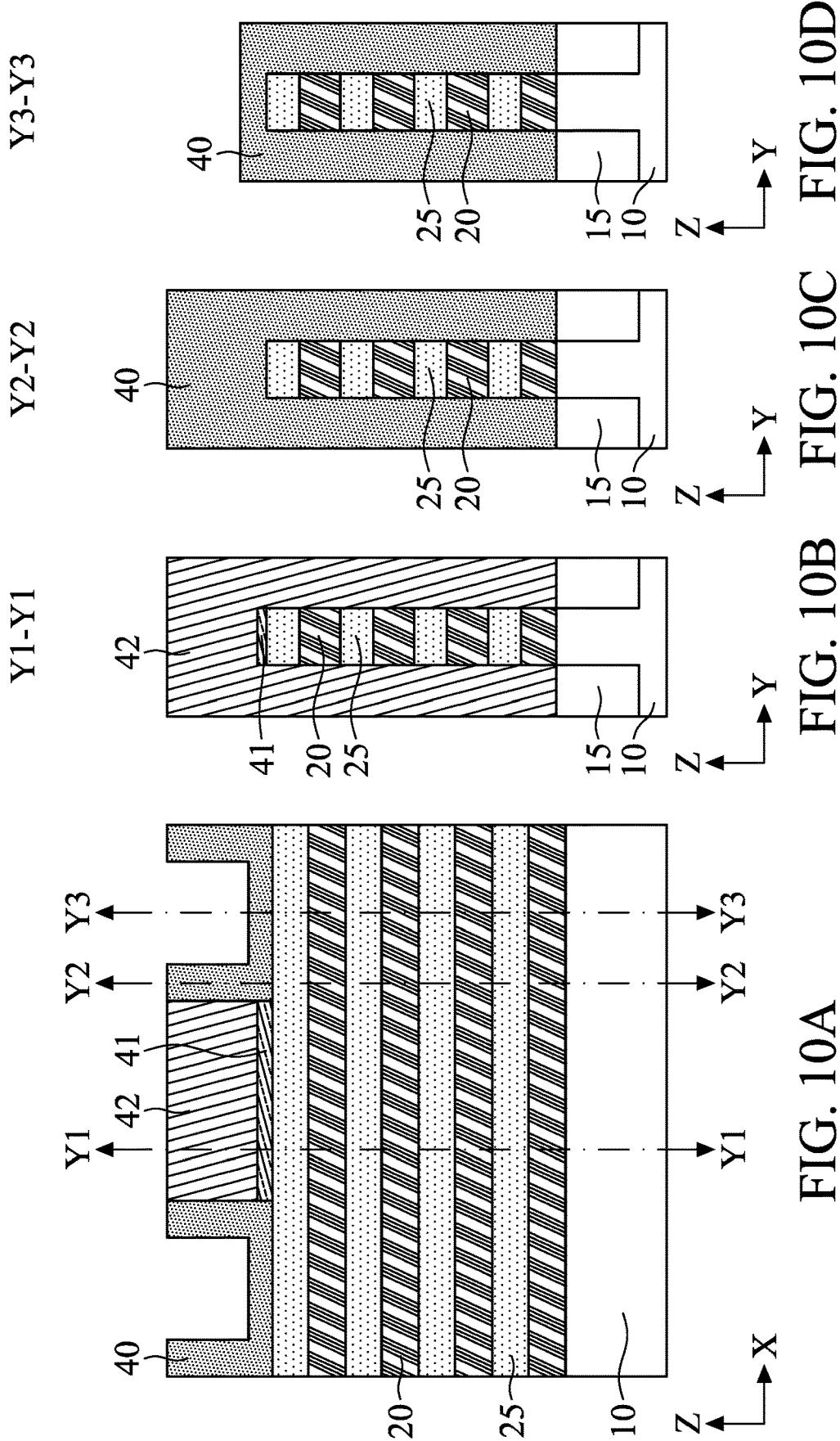

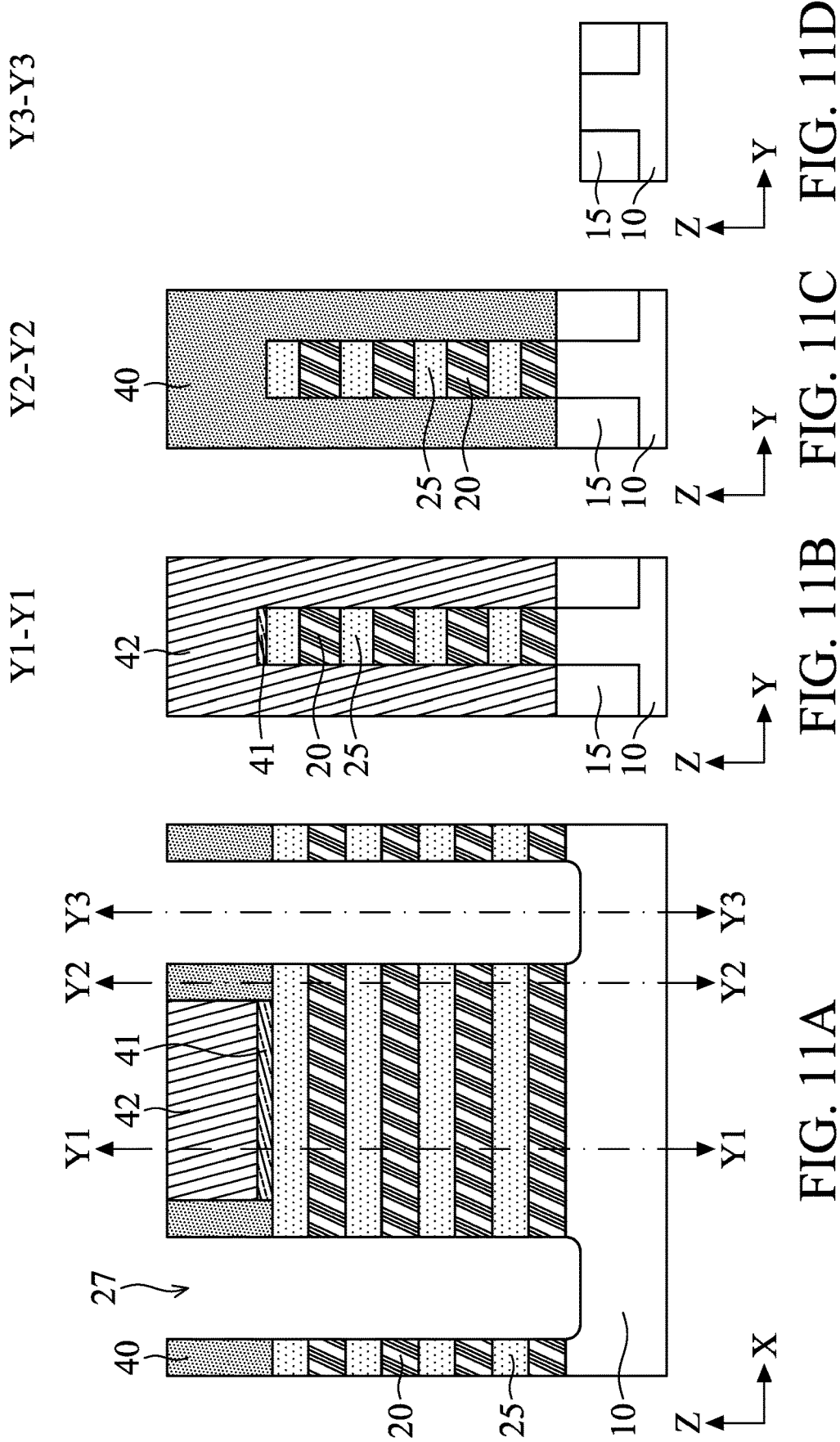

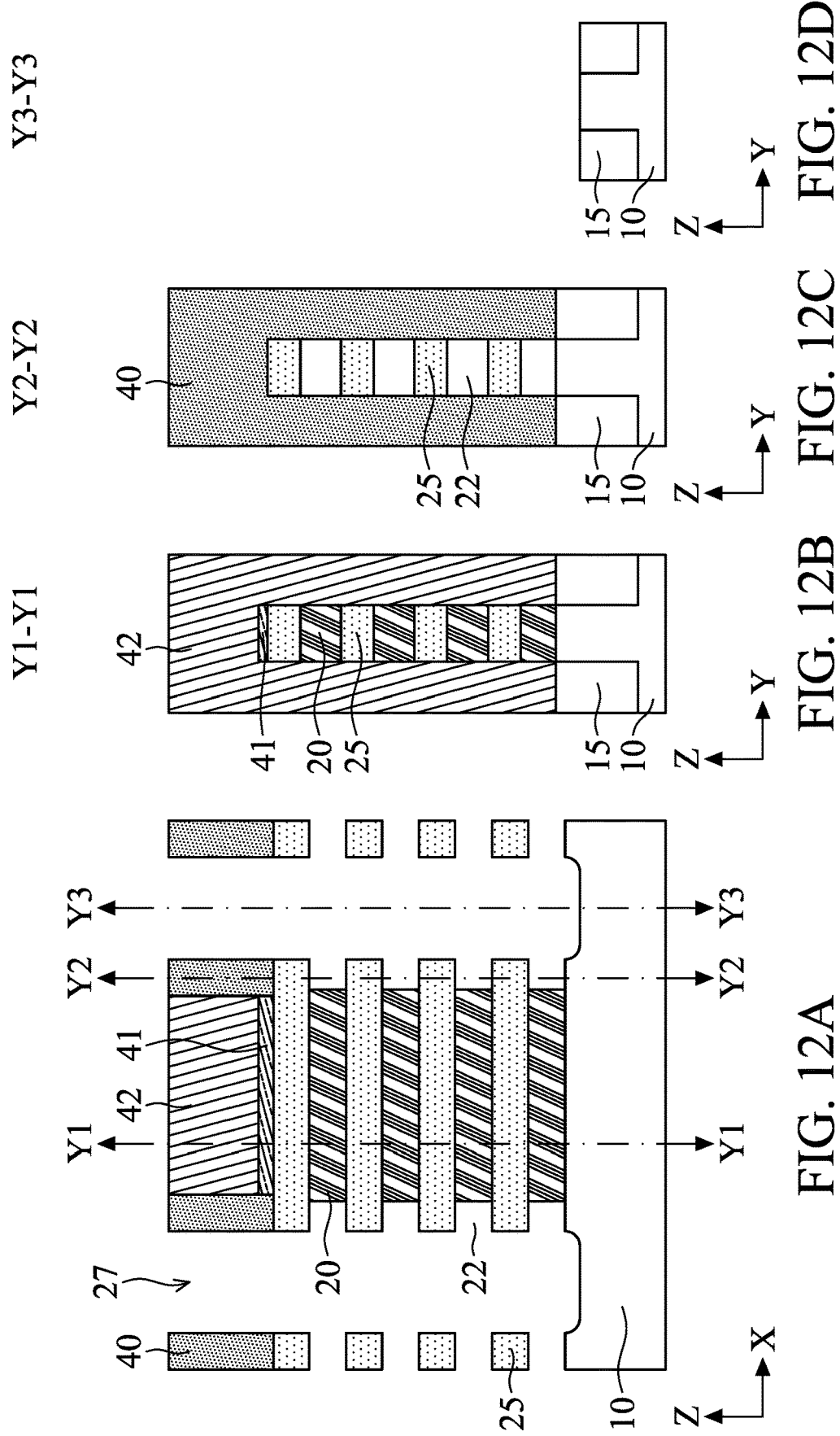

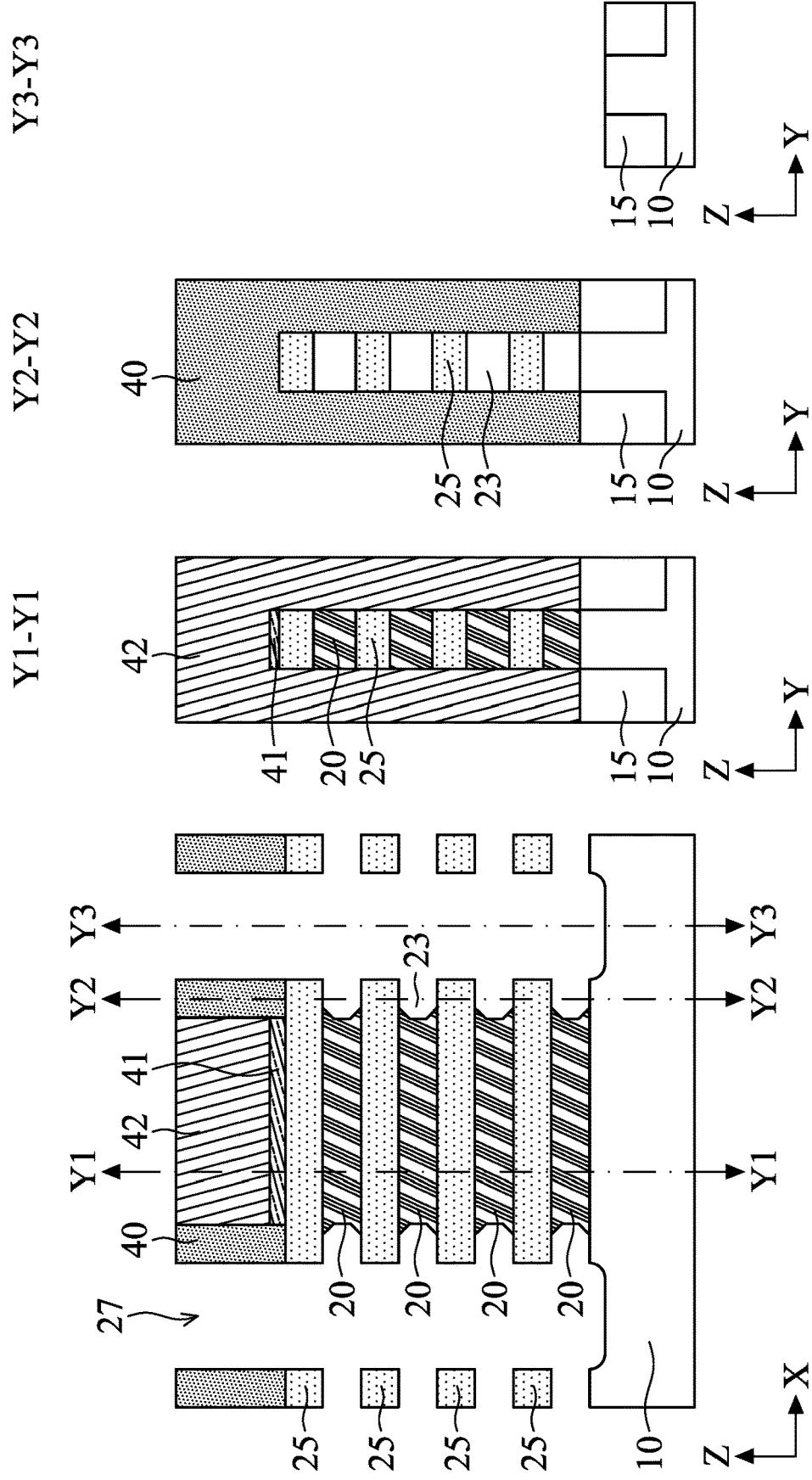

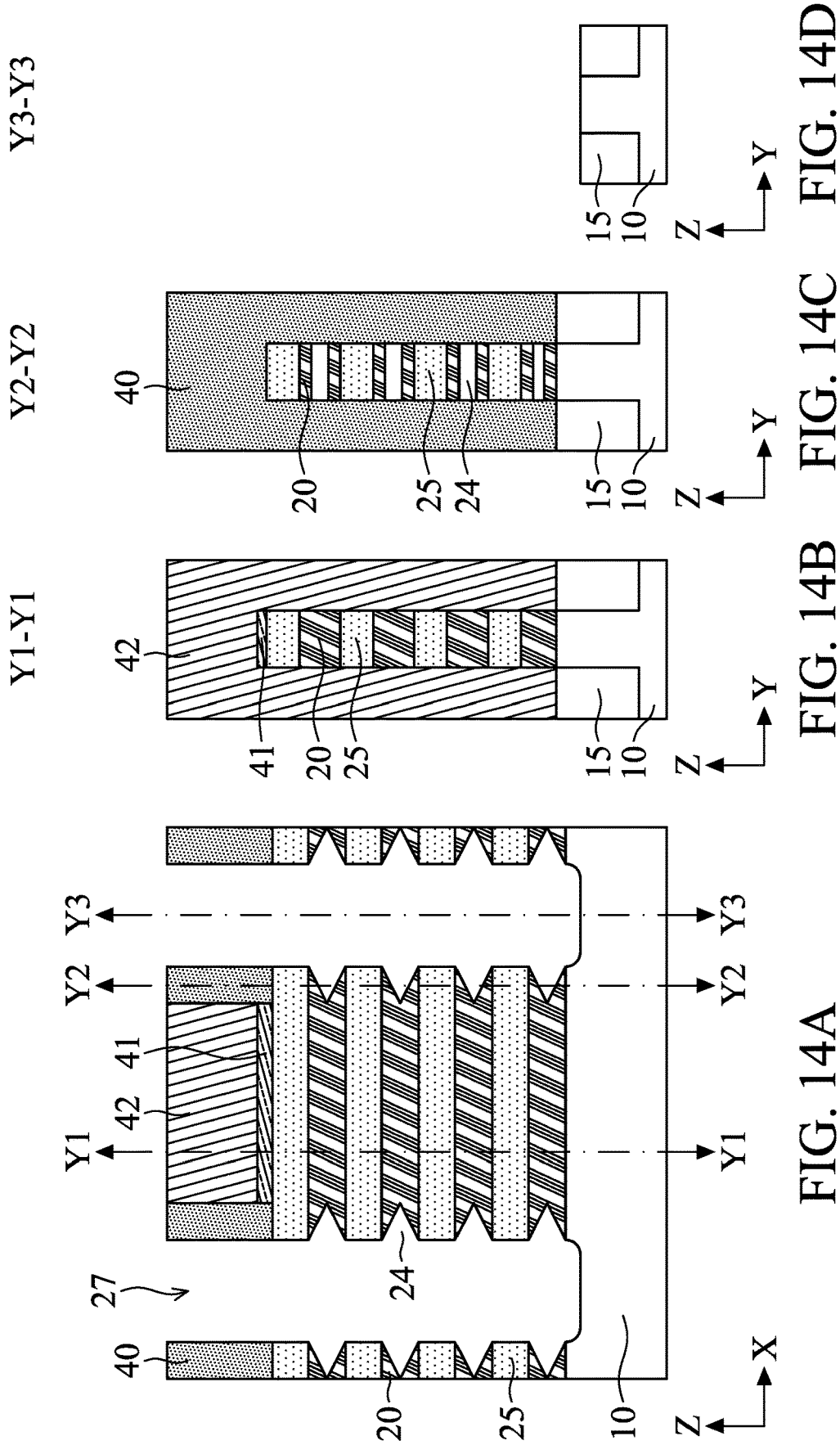

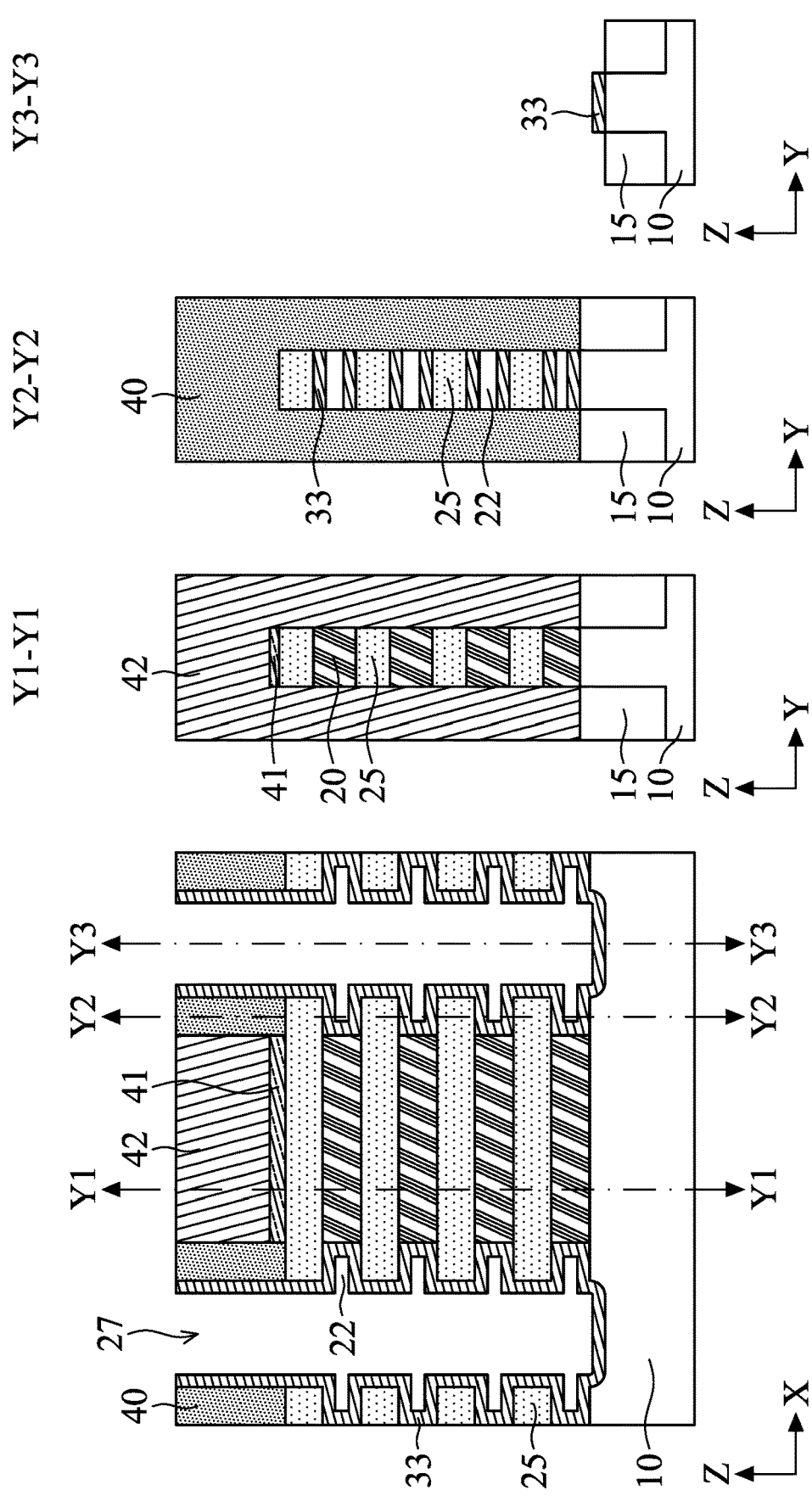

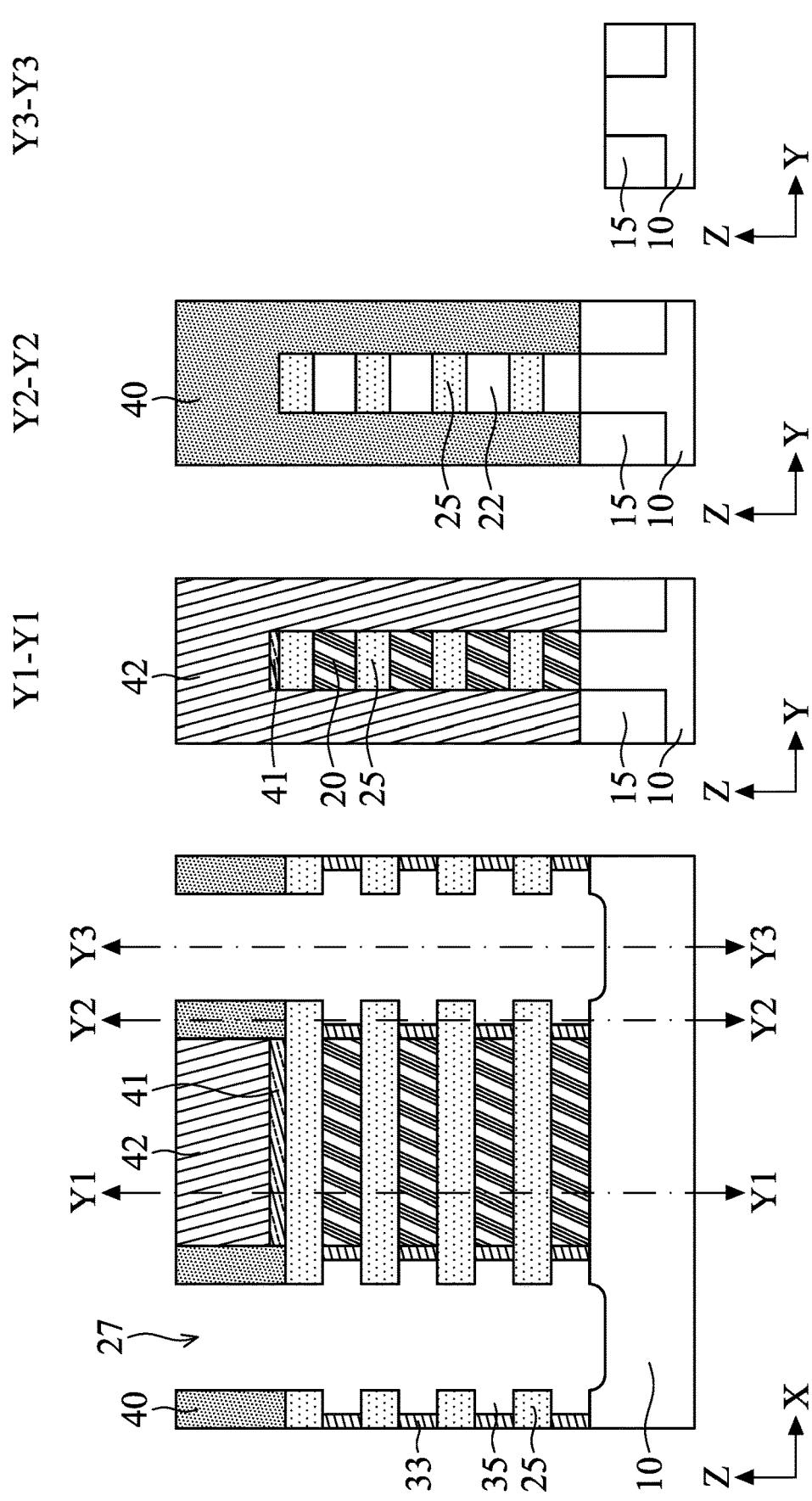

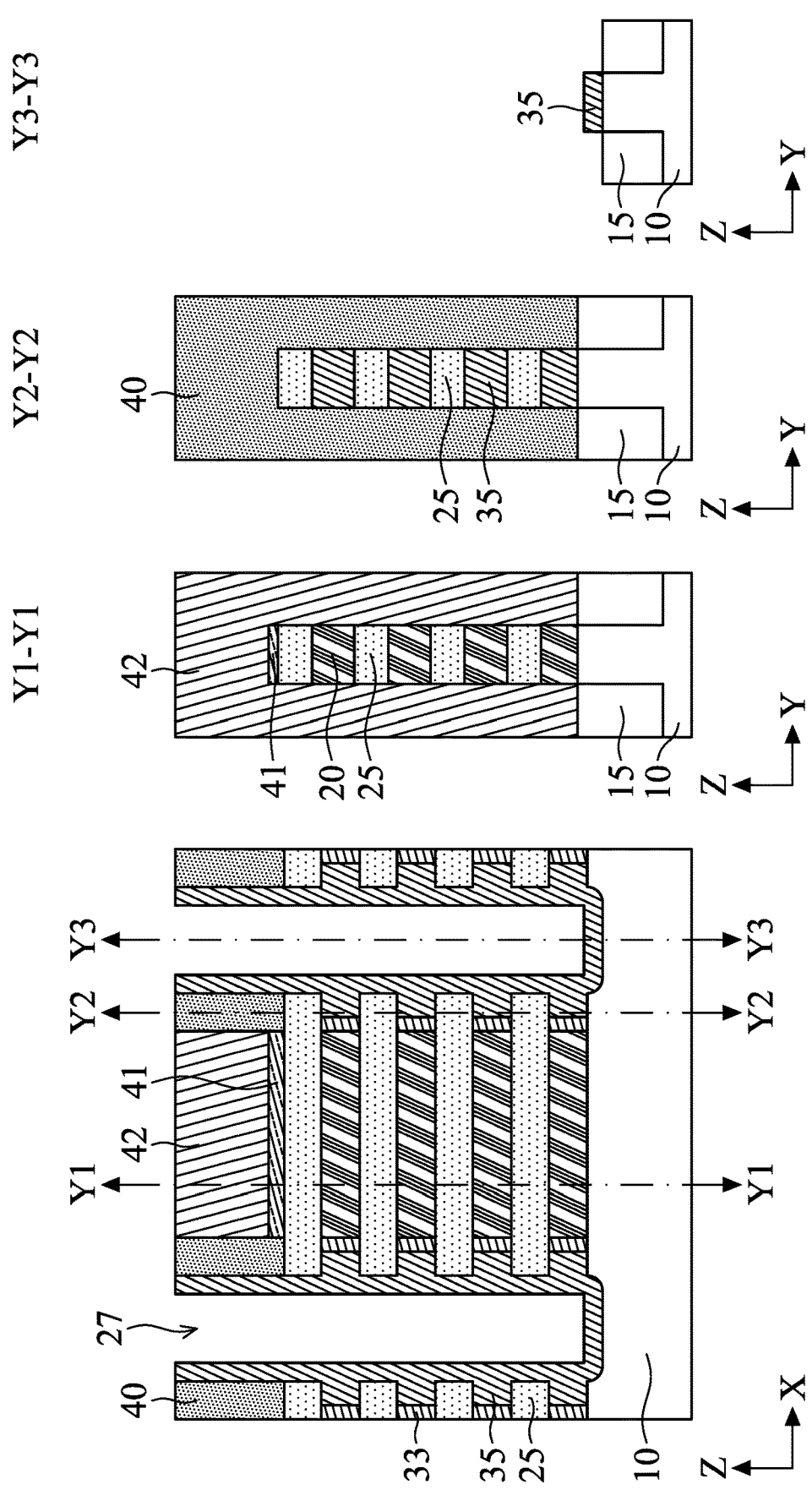

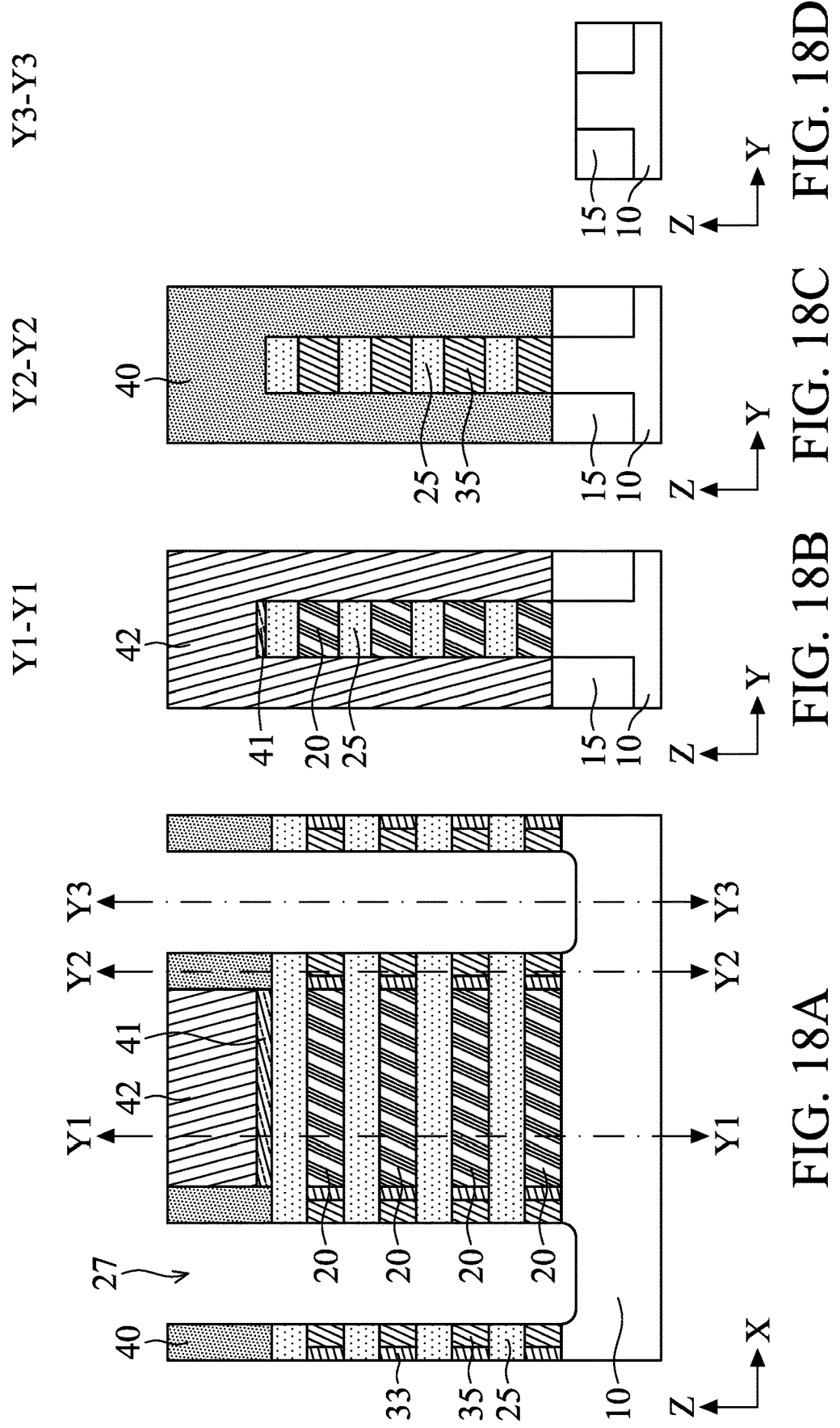

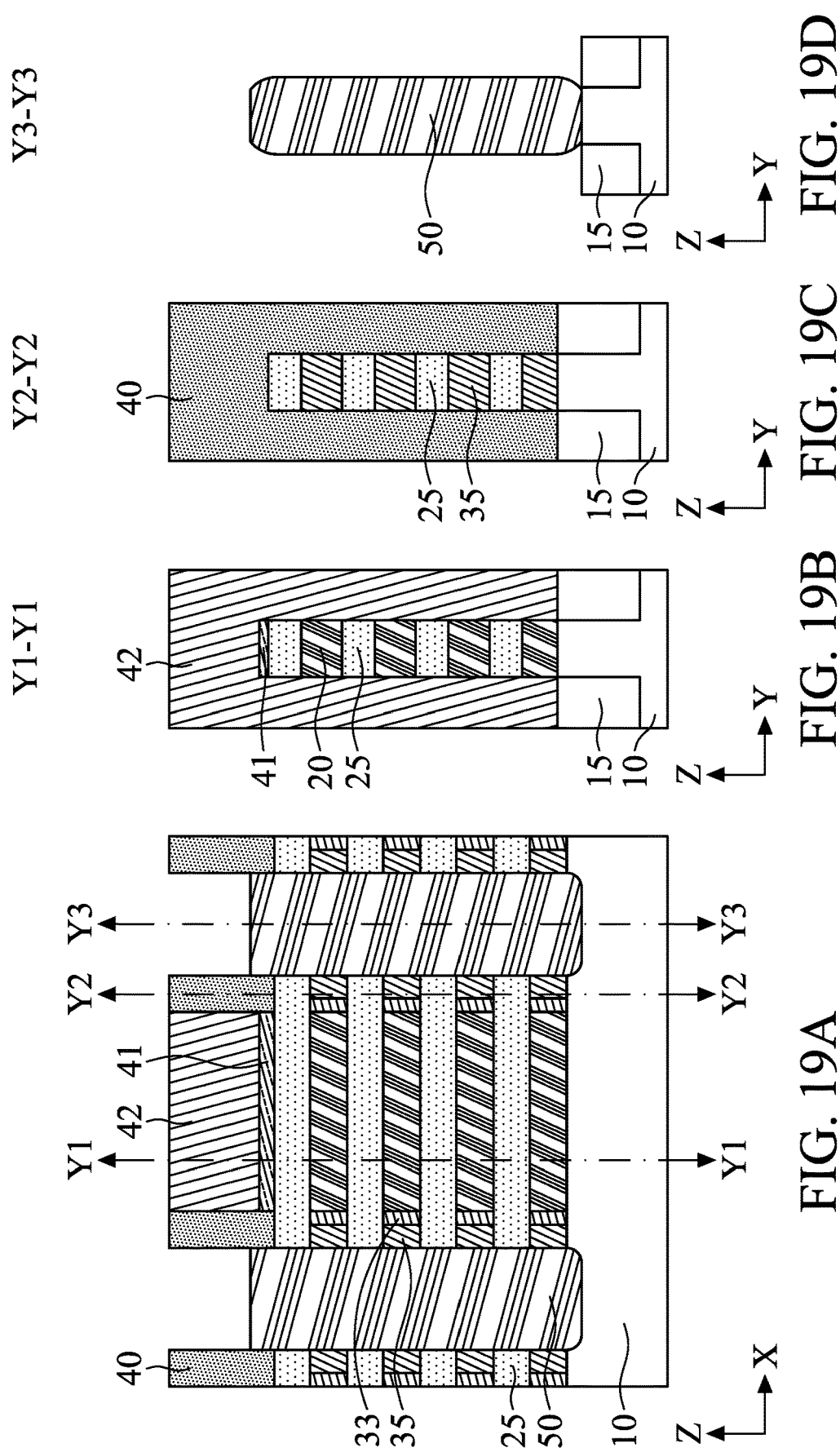

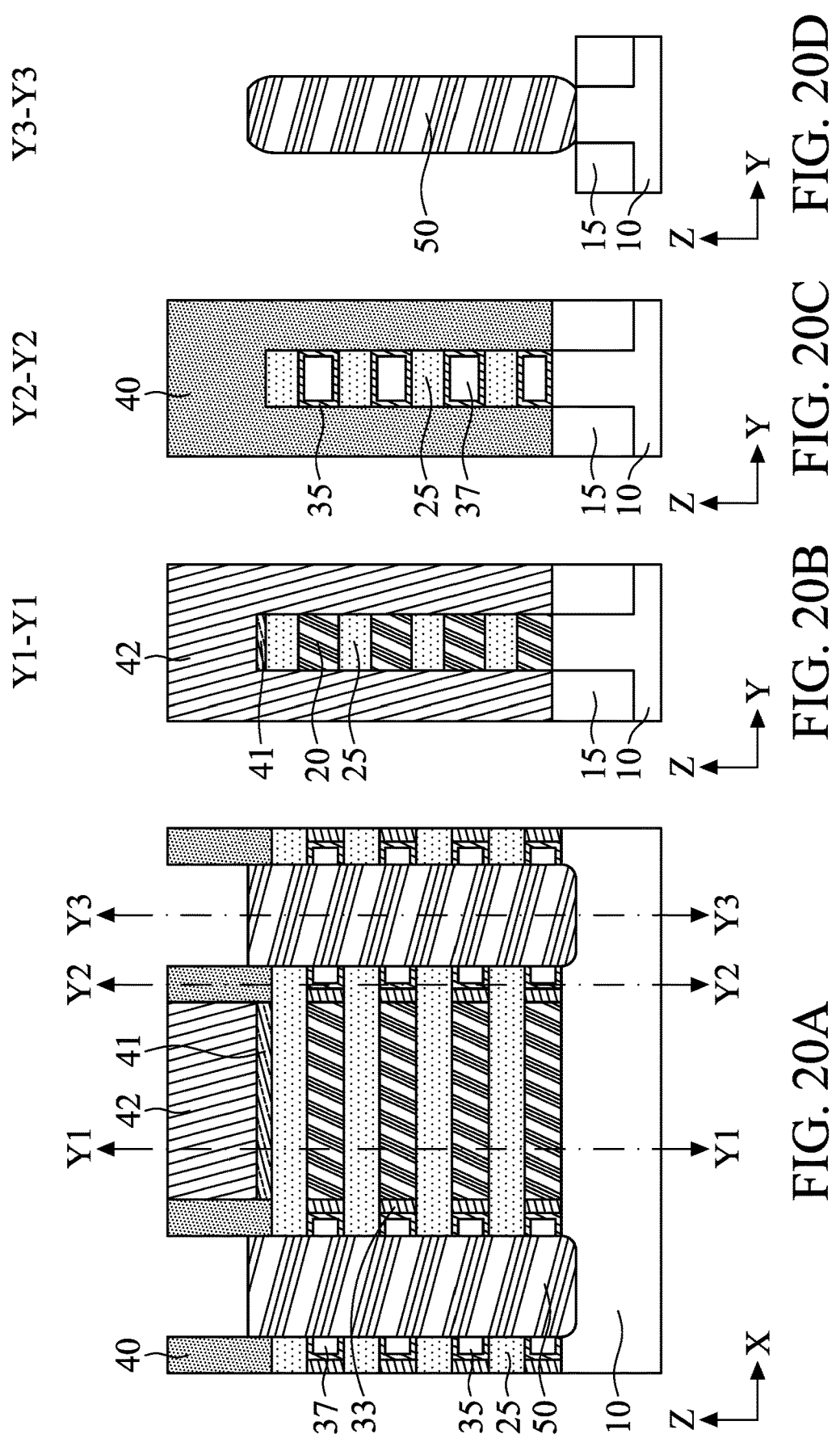

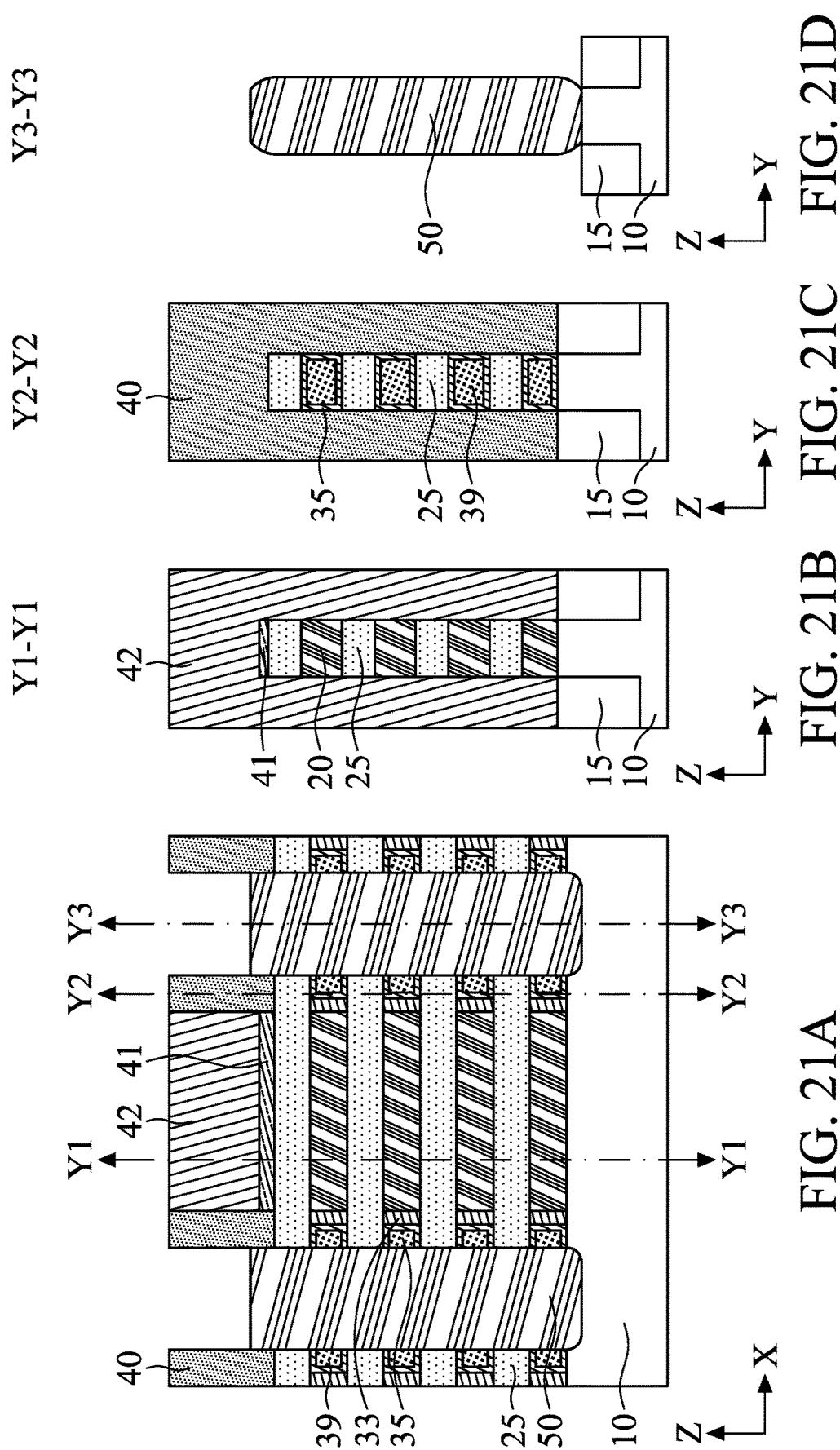

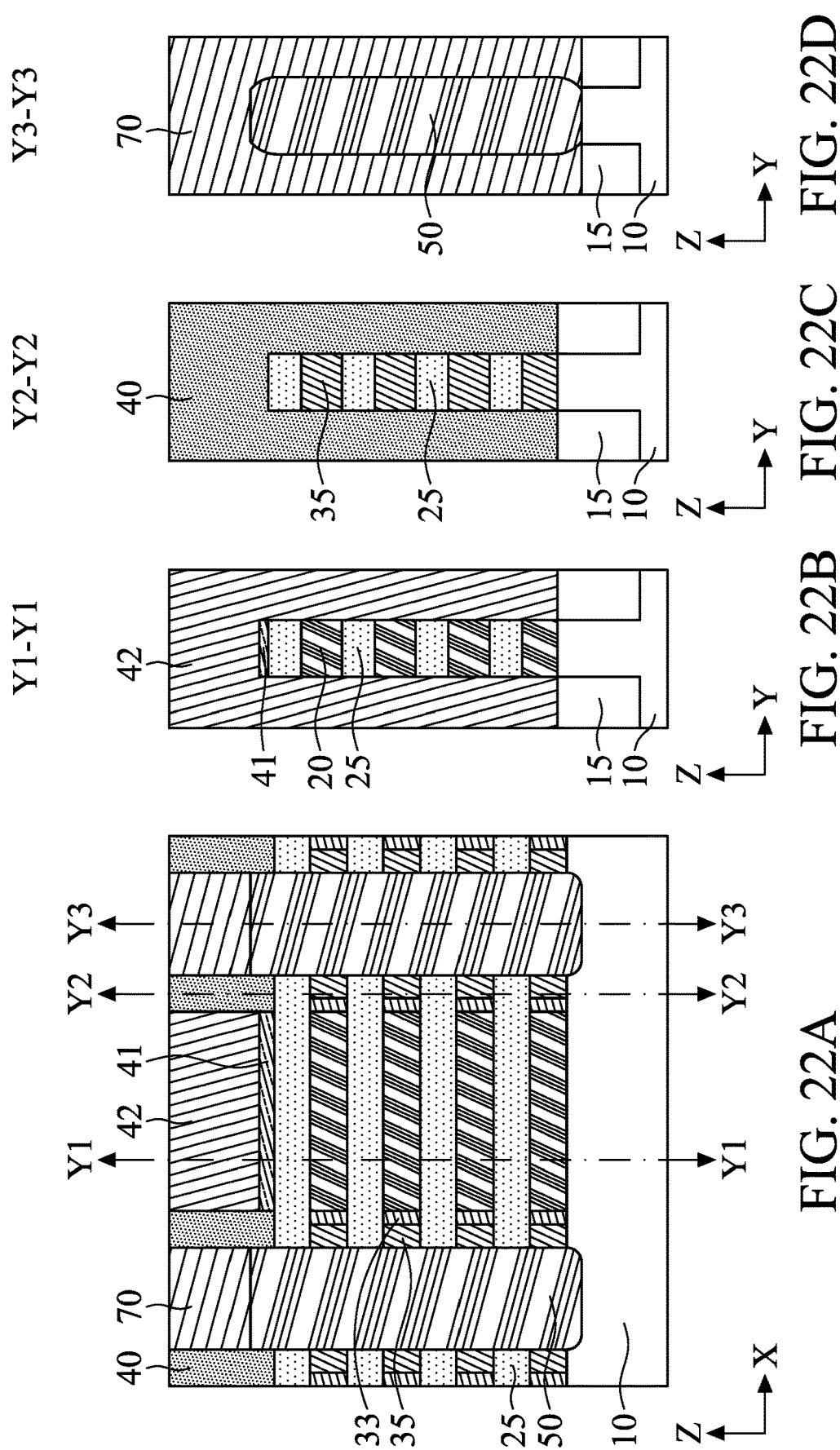

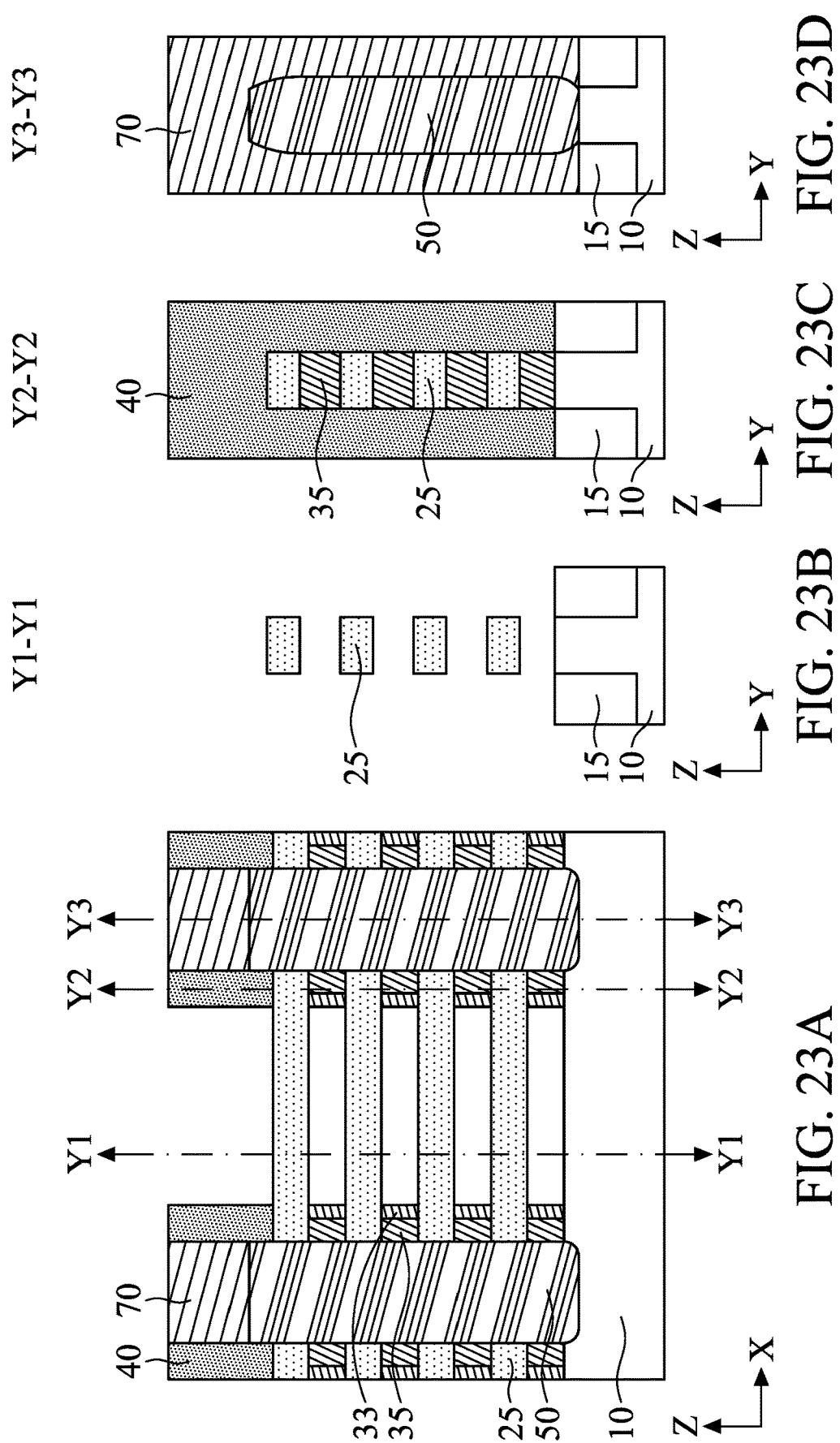

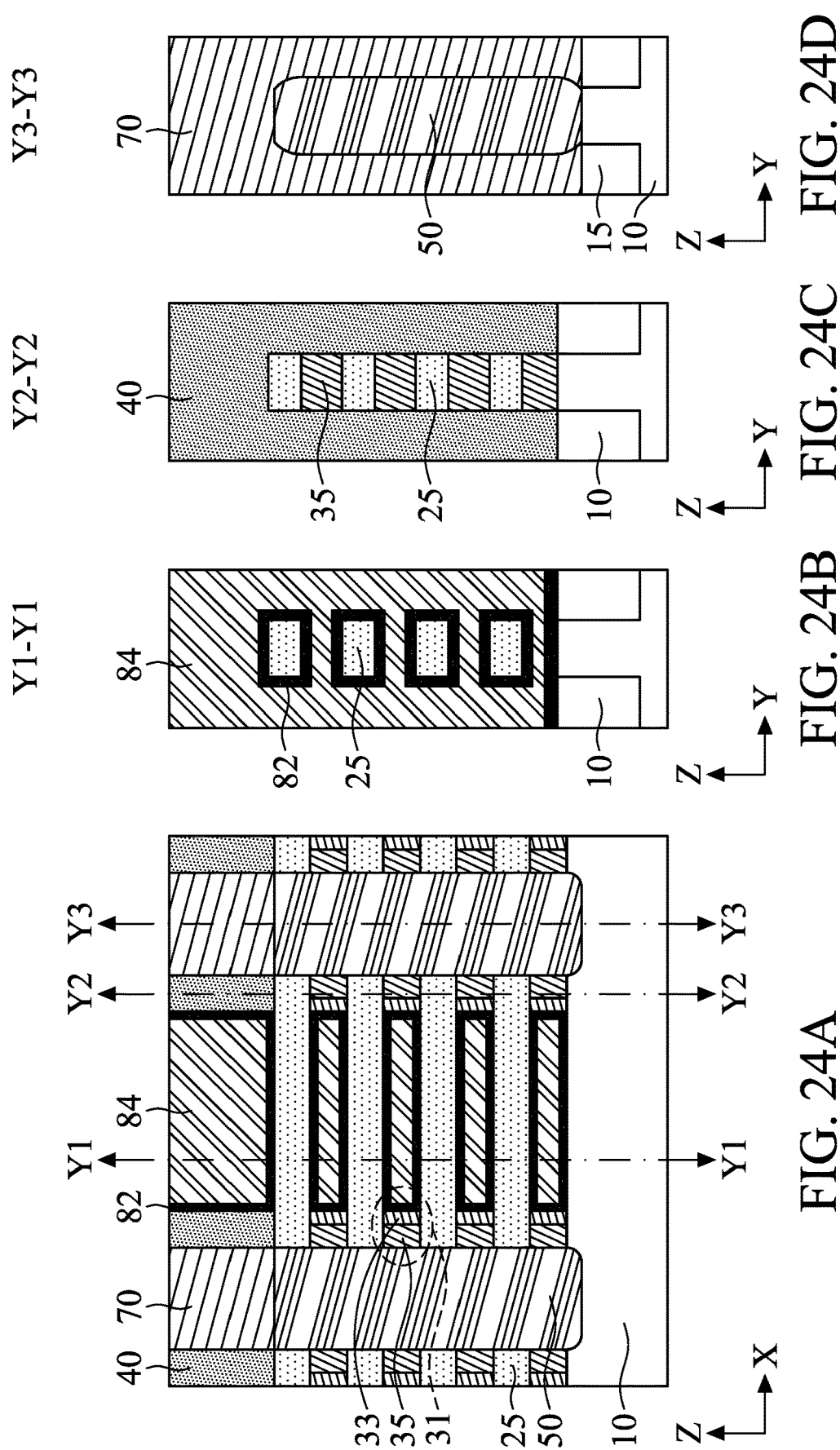

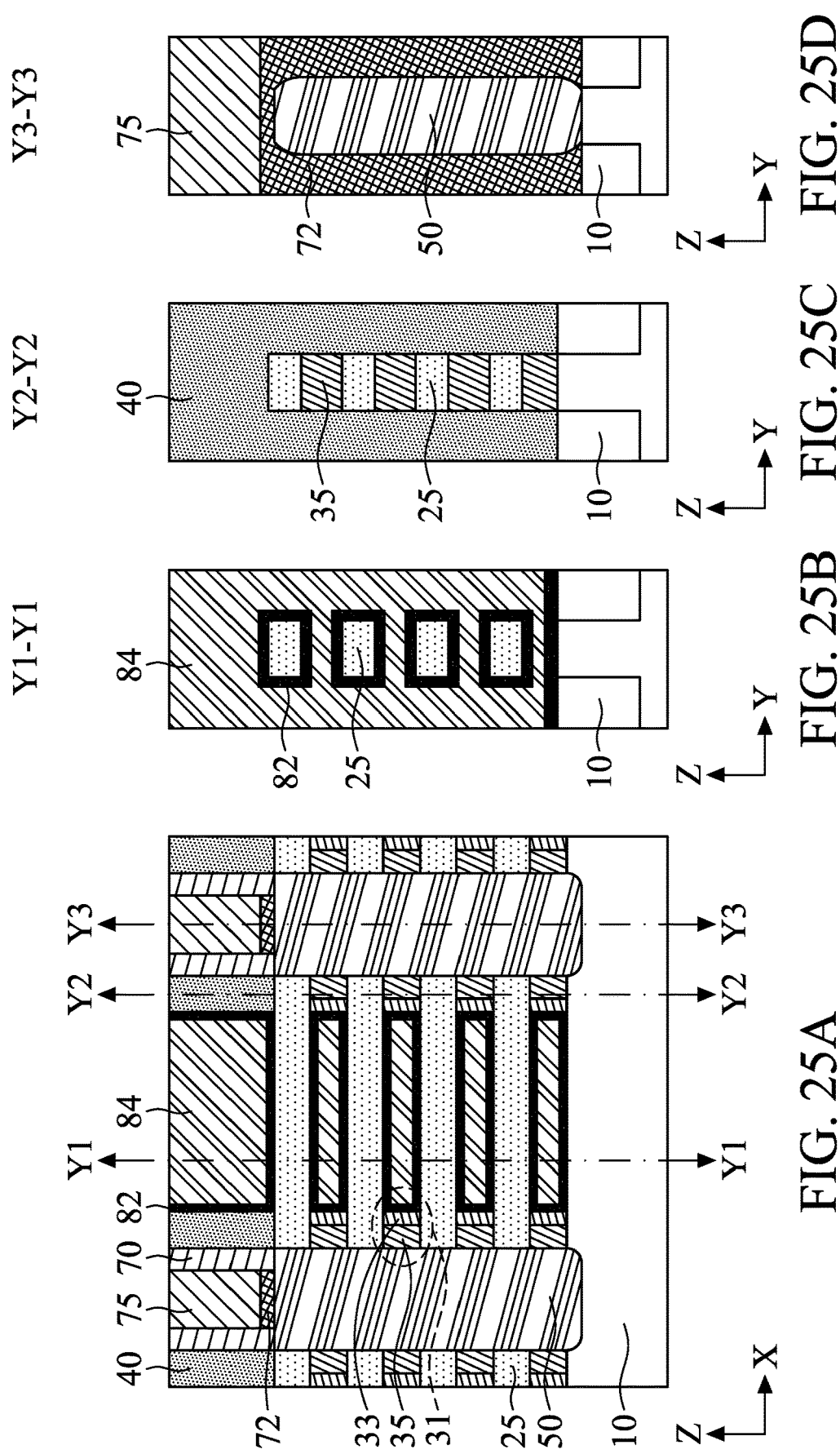

US 11,908,919 B2

MULTI-GATE DEVICES WITH MULTI-LAYER INNER SPACERS AND FABRICATION METHODS THEREOF

PRIORITY DATA

This application claims priority to U.S. Provisional Patent Application Ser. No. 63/031,314 filed on May 28, 2020, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. In a FinFET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub-10 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C, and 1D show various cross-sectional views of a semiconductor FET device, according to an embodiment of the present disclosure.

FIGS. 2A, 2B, 2C, 2D, 2E, 2F, 2G, 2H, 2I, 2J, and 2K show various configurations of inner spacer regions according to some embodiments of the present disclosure.

FIGS. 10A, 10B, 10C, 10D, 11A, 11B, 11C, 11D, 12A, 12B, 12C, 12D, 13A, 13B, 13C, 13D, 14A, 14B, 14C, 14D, 15A, 15B, 15C, 15D, 16A, 16B, 16C, 16D, 17A, 17B, 17C, 17D, 18A, 18B, 18C, 18D, 19A, 19B, 19C, 19D, 20A, 20B, 20C, 20D, 21A, 21B, 21C, 21D, 22A, 22B, 22C, 22D, 23A, 23B, 23C, 23D, 24A, 24B, 24C, 24D, 25A, 25B, 25C, 25D, illustrate cross-sectional views of a semiconductor structure during a fabrication process according to the method of FIGS. 3A and 3B, according to some embodiments of the present disclosure.

DETAILED DESCRIPTION

Figure 3A:
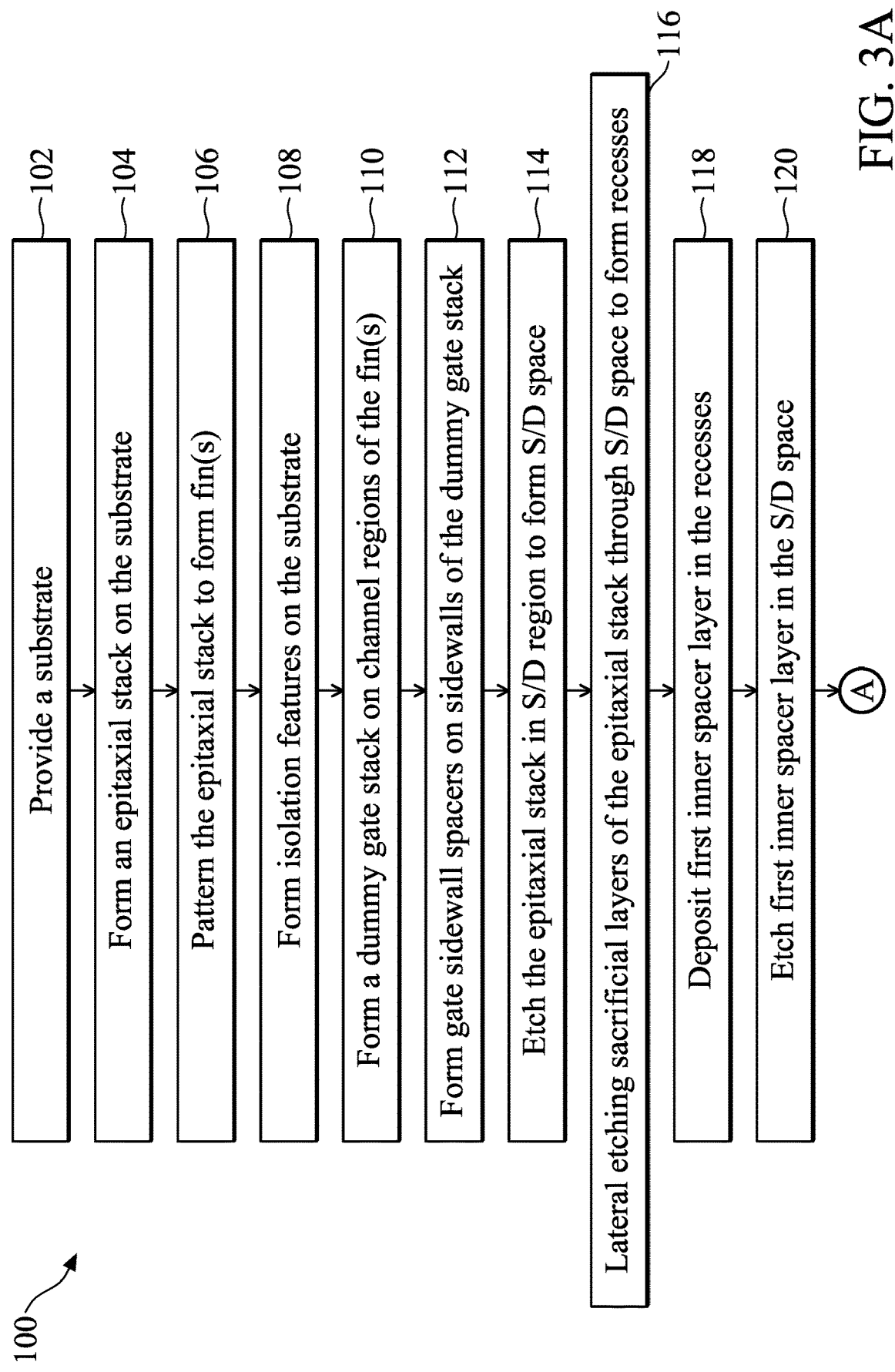
FIGS. 3A and 3B show a flow chart of a method for forming a semiconductor FET device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating multi-gate devices with multi-layer inner spacers. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configuration associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

With transistor dimensions are continually scaled down to sub-10 nm technology nodes and below, it is generally desired to reduce stray capacitance among features of multi-gate transistors, such as capacitance between a gate structure and source/drain contacts, in order to increase switching speed, decrease switching power consumption, and/or decrease coupling noise of the transistors. Certain low-k materials (e.g., with a dielectric constant lower than that of silicon oxide) have been suggested as insulating materials, such as for inner spacers that interpose metal gate structures and source/drain (S/D) epitaxial features, for providing lower dielectric constant to reduce stray capacitance. However, as semiconductor technology progresses to smaller geometries, the etching loss of low-k materials in inner spacers during a replacement gate (or termed as "gate-last") process flow becomes unneglectable as it causes further reduced distance between the gate structure and source/drain contacts, leading to increased stray capacitance. Embodiments of the present disclosure offer advantages over the existing art, though it is understood that other embodiments may offer different advantages, not all advantages are necessarily discussed herein, and no particular advantage is required for all embodiments. In some embodiments of the present disclosure, multi-layer inner spacers that at least include a low-k dielectric layer and a capping layer that protects the low-k dielectric layer from etching loss are illustrated, which provides a benefit of reducing Cgd (gate-to-drain capacitance) and Cgs (gate-to-source capacitance) of multi-gate devices. Therefore, the speed of the circuit could be further improved. The capping layer also makes it possible to more precisely control the thickness, the shape, and/or the locations of the inner spacers and thus to improve device uniformity and yield rate.

In this disclosure, a source/drain (S/D) refers to a source and/or a drain. It is noted that in the present disclosure, a source and a drain are interchangeably used and the structures thereof are substantially the same.

FIGS. 1A-1D show various cross-sectional views of a semiconductor FET device according to an embodiment of the present disclosure. FIG. 1A is a cross-sectional view along the X direction (source-drain direction), FIG. 1B is a cross sectional view corresponding to Y1-Y1 of FIG. 1A, FIG. 1C is a cross-sectional view corresponding to Y2-Y2 of FIG. 1A, and FIG. 1D shows a cross-sectional view corresponding to Y3-Y3 of FIG. 1A.

As shown in FIGS. 1A-1D, semiconductor channel members (e.g., nanowires or nanosheets) 25 are provided over a semiconductor substrate 10, and vertically arranged along the Z direction (the normal direction of the principal surface of the substrate 10). In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A-1C, the semiconductor channel members 25, which provides channel layers for the semiconductor FET device, are disposed over the substrate 10. The semiconductor channel members 25 may also be referred to as channel layers 25. In some embodiments, the channel layers 25 are disposed over a fin structure (not shown) protruding from the substrate 10. Each of the channel layers 25 is wrapped around by a gate dielectric layer 82 and a gate electrode layer 84. In some embodiments, the gate dielectric layer 82 includes an interfacial layer and a high-k dielectric layer. The gate structure includes the gate dielectric layer 82, the gate electrode layer 84 and sidewall spacers 40. Although FIGS. 1A-1C show four channel layers 25, the number of the channel layers 25 is not limited to four, and may be as small as one or more than four and may be up to ten in some embodiments.

Further, a source/drain (S/D) epitaxial layer 50 is disposed over the substrate 10. The S/D epitaxial layer 50 is in direct contact with the channel layers 25, and is separated from the gate dielectric layer 82 by the inner spacers 31. As shown FIG. 1A, the cross section along the X direction of the inner spacers 31 has a substantially rectangular shape. As will be discussed in more detail below in association with FIGS. 2A-2K, the cross section along the X direction of the inner spacers 31 may have other shapes in various embodiments. Still referring to FIG. 1A, in some embodiments, each of the inner spacers 31 includes at least a first insulating layer 33 and a second insulating layer 35. The first insulating layer 33 is conformally formed on the inner surface of the inner spacers 31 that directly interfacing with the gate dielectric layer 82, and is in contact with parts of end portions of adjacent two channel layers 25. The second insulating layer 35 interpose the first insulating layer 33 and the S/D epitaxial layer 50, and is in contact with parts of end portions of adjacent two channel layers 25.

An interlayer dielectric (ILD) layer 70 is disposed over the S/D epitaxial layer 50, a conductive contact layer 72 is disposed on the S/D epitaxial layer 50, and a conductive plug 75 passing though the ILD layer 70 is disposed over the conductive contact layer 72. The conductive contact layer 72 includes one or more layers of conductive material. In some embodiments, the conductive contact layer 72 includes a silicide layer, such as WSi, NiSi, TiSi or CoSi or other suitable silicide material.

FIGS. 2A-2K show various configurations of inner spacers 31 according to embodiments of the present disclosure. FIGS. 2A-2D show the inner spacers 31 with a rectangular cross section, FIGS. 2E-2H show the inner spacers 31 with (100) and (110) facets, and FIGS. 2I-2K show the inner spacer regions with a triangular cross section with (111) facets. By appropriately selecting the principal surface crystalline orientation of the substrate 10 and/or types of etching solutions used to form recesses for depositing inner spacers therein, the cross-sectional shape of the inner spacers 31 can be designed for specific purposes in various embodiments.

The inner spacer 31 includes multiple dielectric layers. The first insulating layer 33 is located at a gate structure side and the second insulating layer 35 is located at an S/D side. In various embodiments, the second insulating layer 35 includes an oxide-containing compound, such as silicon oxide, silicon oxynitride, or a combination thereof. Generally, oxide-containing compound provides an insulating layer with relatively low dielectric constant, such as a dielectric constant below 4.5 (e.g., in a range from about 3.5 to about 4.5 in some embodiments). However, oxide-containing compound may suffer significant etching loss from subsequent etching processes in dummy gate removal and channel member release due to its relatively low etching contrast to other materials used in dummy gate and sacrificial epitaxial layers. The first insulating layer 33 functions as a capping layer or an etch stop layer to protect the second insulating layer 35 from such etching loss. A dielectric constant of the first insulating layer 33 is larger than that of the second insulating layer 35, such as larger than 5 (e.g., in a range from about 5 to 6 in some embodiments). In various embodiments, the first insulating layer 33 includes a carbon concentration higher than the second insulating layer 35. In some embodiments, the first insulating layer 33 is a nitrogen-rich compound doped with carbon. In one example, the first insulating layer 33 includes silicon carbon oxynitride with both nitrogen and carbon concentrations higher than those of the second insulating layer 35, respectively, but with oxygen concentration lower than that of the second insulating layer 35. The nitrogen-rich compound with the existence of carbon increases etching contrast of the first insulating layer 33. As a comparison, the second insulating layer 35 may be substantially free of carbon. The term "substantially free of carbon" is used herein to refer to a carbon atomic % less than 1%. In one example, the second insulating layer 35 includes silicon oxynitride. In furtherance of the example, the first insulating layer 33 includes silicon in atomic % from about 25% to about 35%, oxygen in atomic % from about 30% to about 40%, carbon in atomic % from about 5% to about 30%, nitrogen in atomic % from about 15% to about 20%, while the second insulating layer 35 includes silicon in atomic % at about 30%, oxygen in atomic % larger than about 60%, carbon in atomic % less than 1%, nitrogen in atomic % from about 5% to about 10%.

As shown in FIGS. 2A-2C and 2E-2G, the first insulating layer 33 is located at a gate structure side and not in contact with the S/D epitaxial layer 50, the second insulating layer 35 is located at an S/D side and not in contact with the gate structure. A thickness of the inner spacer 31 measured along the X direction may range from about 3 nm to about 10 nm, which is chosen based on device performance considerations. A thickness of the first insulating layer 33 measured along the X direction from one edge in contact with the second insulating layer 35 to an opposing edge in contact with the gate structure may range from about 1 nm to about 5 nm. A thickness of the second insulating layer 35 measured along the X direction from one edge in contact with the S/D epitaxial layer 50 to an opposing edge in contact with the first insulating layer 33 may range from about 1 nm to about 6 nm. In some embodiments, a thickness of the first insulating layer 33 is less than that of the second insulating layer 35 in order to reduce the overall effective dielectric constant of the inner spacer 31.

In certain embodiments, as shown in FIGS. 2D and 2H, the inner spacer 31 further includes a third insulating layer 39. The third insulating layer 39 may have substantially the same material composition with the first insulating layer 33 and function as a capping layer or an etch stop layer at the S/D side, which further protects the second insulating layer 35 from etching loss on the S/D side, such as during S/D space cleaning process. In one example, both the first insulating layer 33 and the third insulating layer 39 include silicon carbon oxynitride, while the first insulating layer 33 has a carbon concentration higher than the third insulating layer 39. The third insulating layer 39 is in contact with the S/D epitaxial layer 50 and may separate the second insulating layer 35 from contacting the S/D epitaxial layer 50. A thickness of the first insulating layer 33 measured along the X direction from one edge in contact with the second insulating layer 35 to an opposing edge in contact with the gate structure may range from about 1 nm to about 5 nm. A thickness of the second insulating layer 35 measured along the X direction from one edge in contact with the third insulating layer 39 to an opposing edge in contact with the first insulating layer 33 may range from about 1 nm to about 3 nm. A thickness of the third insulating layer 39 measured along the X direction from one edge in contact with the S/D epitaxial layer 50 to an opposing edge in contact with the second insulating layer 35 may range from about 1 nm to about 3 nm. In some embodiments, a thickness of the first insulating layer 33 is larger than that of the third insulating layer 39 as etching in the gate structure side is usually stronger than in the S/D side.

In certain embodiments, as shown in FIGS. 2B, 2C, 2F, 2G, the second insulating layer 35 has a U-shape (90 degree rotated) cross section and surrounds lateral ends of the channel layers 25. In some embodiments, such as in FIGS. 2B and 2F, an air gap 37 is located at an S/D side to be in contact with the S/D epitaxial layer 50. The air gap 37 is jointly defined by the U-shape of the second insulating layer 35 and the S/D epitaxial layer 50. A thickness of the air gap 37 measured along the X direction may range from about 1 nm to about 3 nm. The air gap 37 further reduces the overall effective dielectric constant of the inner spacer 31. In some alternative embodiments, no air gap is formed in the U-shape of the insulating layer 35. In such a case, as shown in FIGS. 2C and 2G, the third insulating layer 39 is disposed and surrounded by the U-shape of the second insulating layer 35.

In other embodiments, as shown in FIGS. 2I-2K, the first insulating layer 33 is conformally deposited on exposed V-shape (90 degree rotated) sidewalls of the gate structure and also in contact with the S/D epitaxial layer 50. The second insulating layer 35 is in contact with the S/D epitaxial layer 50 and separated from contacting the gate structure by the first insulating layer 33. An air gap 37 or a third insulating layer 39 may be surrounded by the second insulating layer 35, as shown in FIGS. 2I and 2K.

Figure 3B:
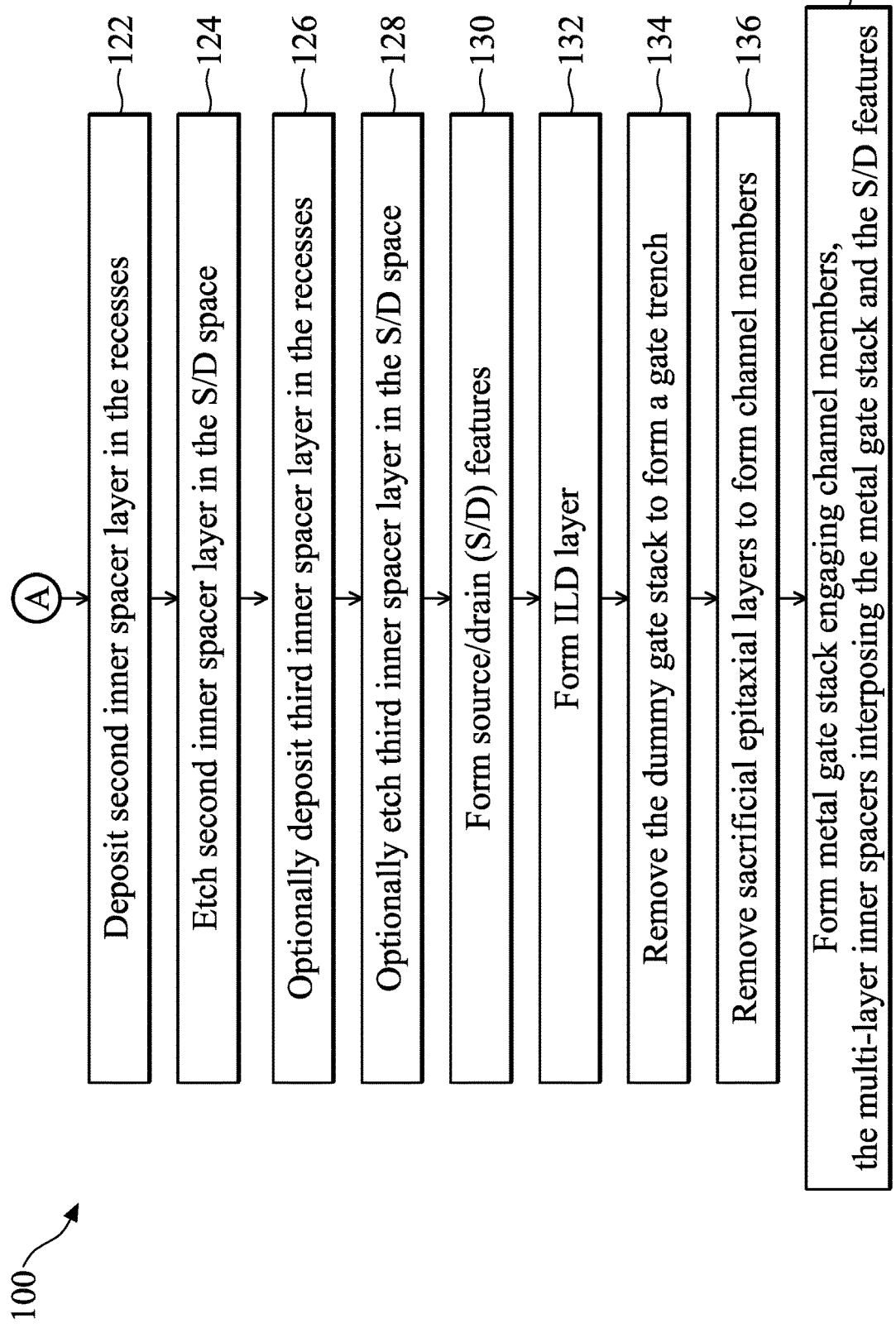

Illustrated in FIGS. 3A and 3B is a method 100 of semiconductor fabrication including fabrication of multi-gate devices. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 4-25D. FIGS. 4-9 are perspective views of an embodiment of a semiconductor FET device according to various stages of the method 100 of FIGS. 3A and 3B. FIGS. 10A-25D are cross-sectional views of embodiments of the semiconductor FET device according to various stages of the method 100 of FIGS. 3A and 2B, where figures numbered with suffix "A" represent a cross-sectional view along the X direction (source-drain direction), figures numbered with suffix "B"

represent a cross-sectional view corresponding to Y1-Y1 cut of the respective figure numbered with suffix "A", figures numbered with suffix "C" represent a cross-sectional view corresponding to Y2-Y2 cut of the respective figures numbered with suffix "A", and figures numbered with suffix "D" represent a cross-sectional view corresponding to Y3-Y3 cut of the respective figures numbered with suffix "A".

Figure 4:
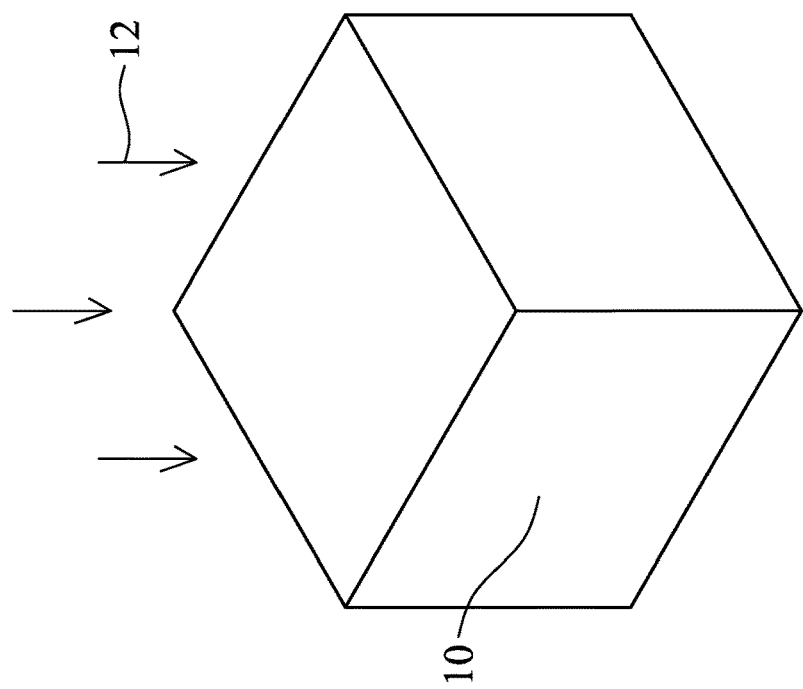
FIGS. 4, 5, 6, 7, 8, and 9 illustrate perspective views of a semiconductor structure during a fabrication process according to the method of FIGS. 3A and 3B, according to one or more aspects of the present disclosure.

Referring to FIG. 4, at operation 102, the method 100 (FIG. 3A) provides (or is provided with) a substrate 10. Impurity ions (dopants) 12 are implanted into the substrate 10 to form a well region. The ion implantation is performed to prevent a punch-through effect. The substrate 10 may include various regions that have been suitably doped with impurities (e.g., p-type or n-type conductivity). The dopants 12 are, for example boron ($BF_2$) for an n-type FinFET and phosphorus for a p-type FinFET.

Figure 5:
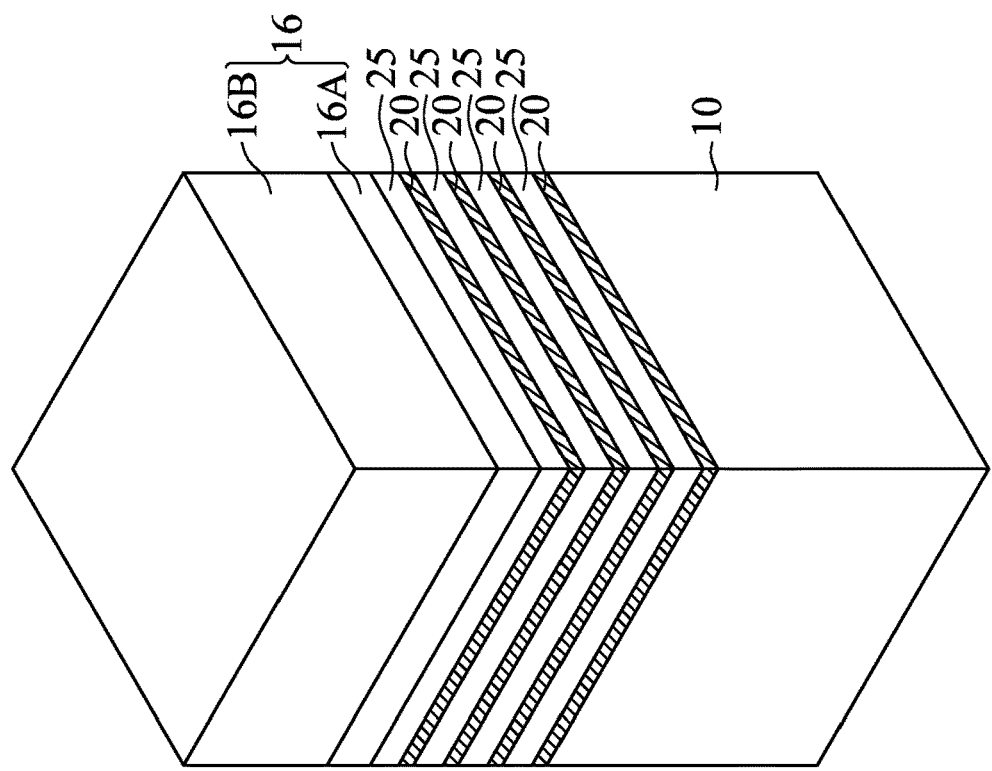

Referring to FIG. 5, at operation 104, the method 100 (FIG. 3A) forms stacked semiconductor layers over the substrate 10. The stacked semiconductor layers include first semiconductor layers 20 and second semiconductor layers 25. Further, a mask layer 16 is formed over the stacked layers.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-y}Ge_y$, where y is in a range from about 0.1 to about 0.4.

Still referring to FIG. 5, four layers of the first semiconductor layer 20 and four layers of the second semiconductor layer 25 are disposed. However, the number of the layers are not limited to four, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 2 nm to about 20 nm in some embodiments, and is in a range from about 5 nm to about 15 nm in other embodiments. The thickness of the second semiconductor layers 25 is in a range from about 2 nm to about 20 nm in some embodiments, and is in a range from about 5 nm to about 15 nm in other embodiments. The thickness of each of the first semiconductor layers 20 may be the same, or may vary. In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to about 40 nm in other embodiments.

In some embodiments, the mask layer 16 includes a first mask layer 16A and a second mask layer 16B. The first mask layer 16A is a pad oxide layer made of a silicon oxide, which can be formed by a thermal oxidation. The second mask layer 16B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 16 is patterned into a mask pattern by using patterning operations including photo-lithography and etching.

Figure 6:
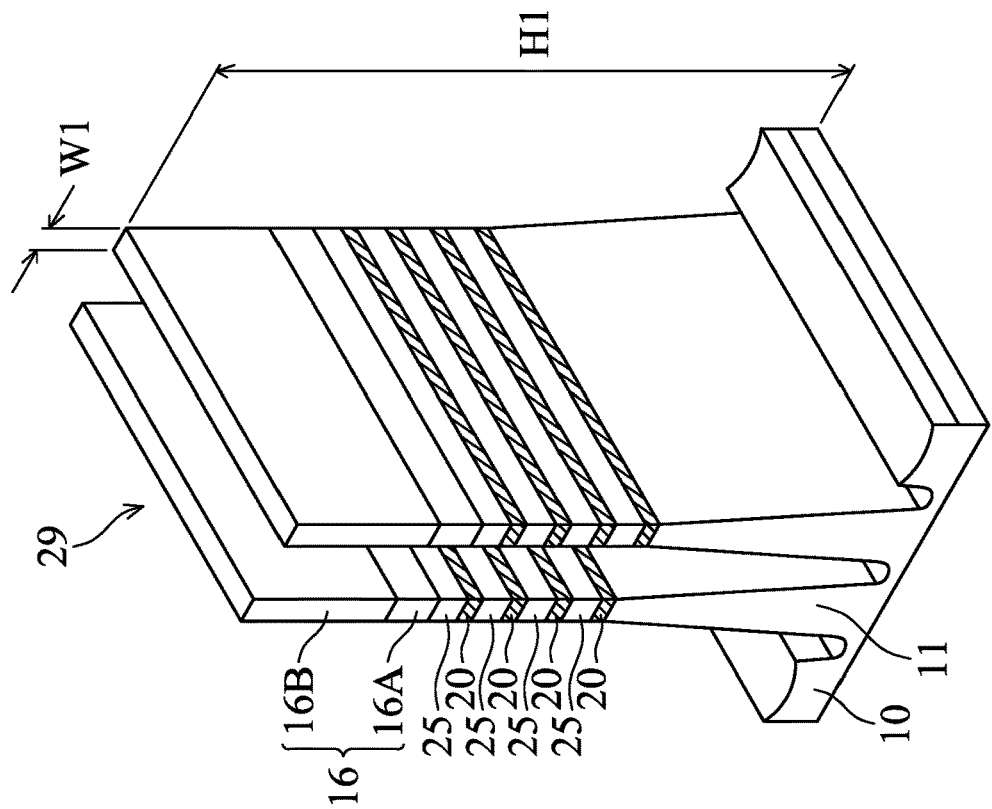

Referring to FIG. 6, at operation 106, the method 100 (FIG. 3A) patterns the stacked layers of the first and second semiconductor layers 20, 25 by using the patterned mask layer 16, thereby the stacked layers are formed into fin structures 29 extending in the X direction. In FIG. 6, two fin structures 29 are arranged in the Y direction. But the number of the fin structures is not limited to two, and may be as small as one and three or more. In some embodiments, one or more dummy fin structures are formed on both sides of the fin structures 29 to improve pattern fidelity in the patterning operations. The fin structures 29 have upper portions constituted by the stacked semiconductor layers 20, 25 and well portions 11. The width W1 of the upper portion of the fin structure along the Y direction is in a range from about 10 nm to about 40 nm in some embodiments, and is in a range from about 20 nm to about 30 nm in other embodiments. The height H1 along the Z direction of the fin structure is in a range from about 100 nm to about 200 nm.

The stacked fin structure 29 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 29.

The method 100 (FIG. 3A) proceeds to operation 108 in forming isolation features on the substrate 10. In some embodiments, after the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, a fin liner layer 13 is formed over the fin structures before forming the insulating material layer. The fin liner layer 13 is made of SiN or a silicon nitride-based material (e.g., SiON, SiCN or SiOCN).

In some embodiments, the fin liner layers 13 include a first fin liner layer formed over the substrate 10 and sidewalls of the bottom part of the fin structures 11, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

Figure 7:
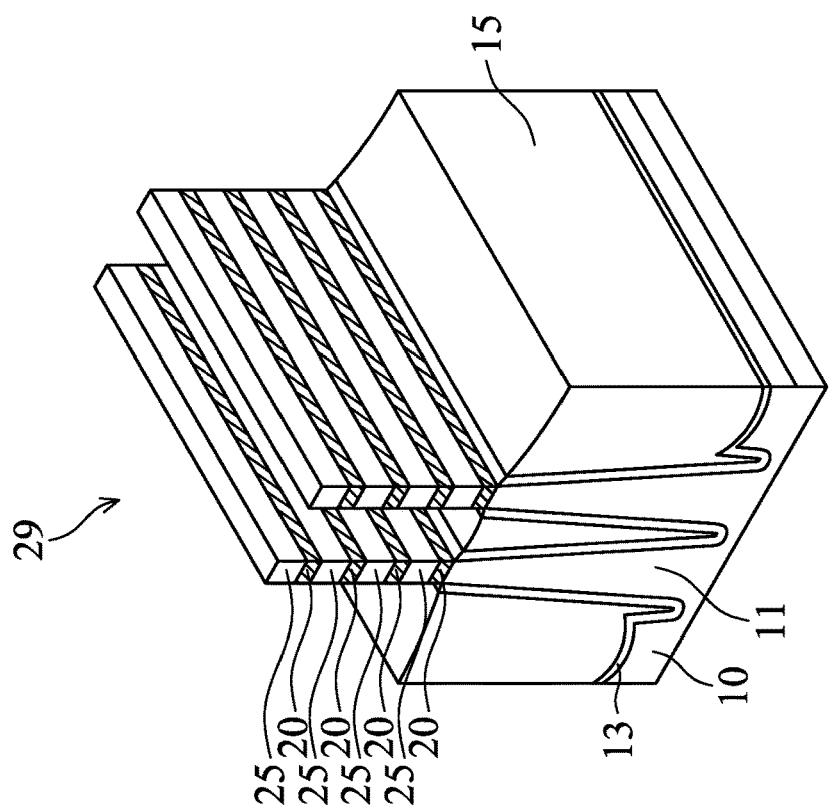

Referring to FIG. 7, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized. In the illustrated embodiment, the insulating material layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires as channel layers of a GAA FET.

Figure 8:
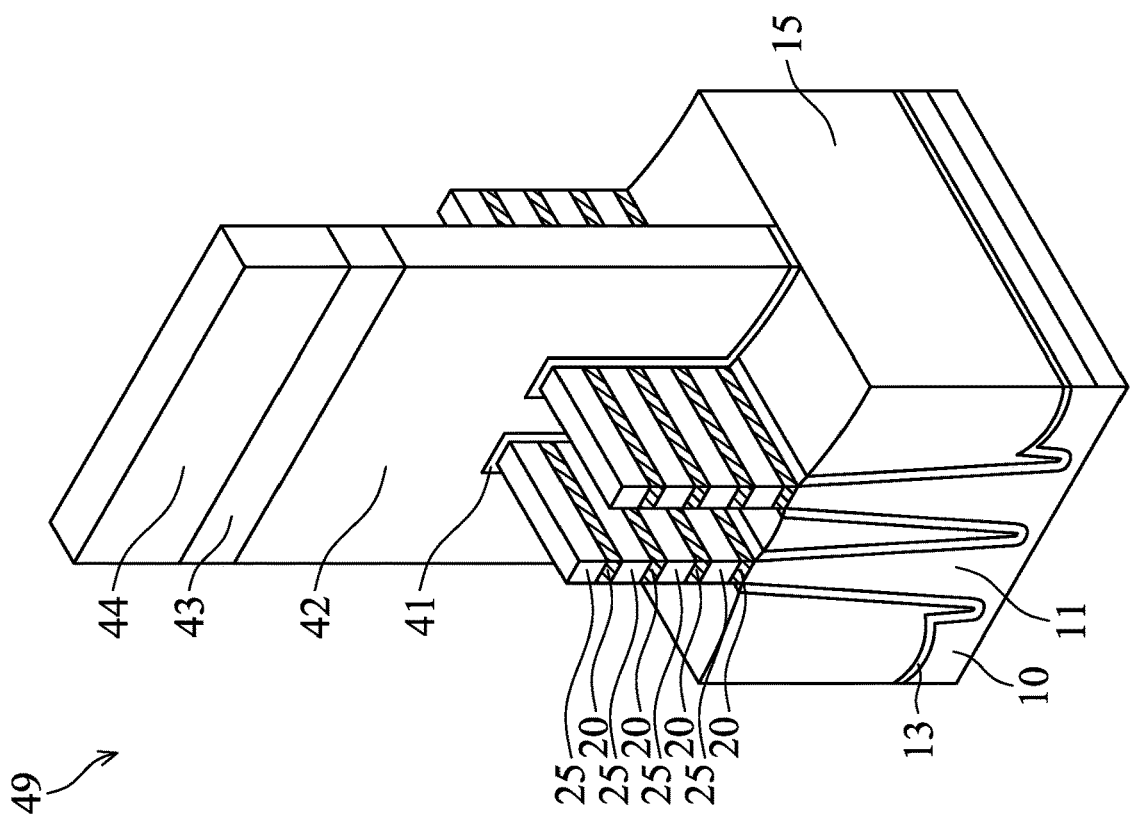

Referring to FIG. 8, at operation 110, the method 100 (FIG. 3A) forms a sacrificial (dummy) gate structure 49. FIG. 8 illustrates a structure after a sacrificial gate structure 49 is formed over the exposed fin structures 29. The sacrificial gate structure 49 is formed over a portion of the fin structures which is to be a channel region. The sacrificial gate structure 49 defines the channel region of the GAA FET. The sacrificial gate structure 49 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 49 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 43 and a silicon oxide mask layer 44.

Next, a patterning operation is performed on the mask layer and sacrificial gate electrode layer is patterned into the sacrificial gate structure 49, as shown in FIG. 37. The sacrificial gate structure includes the sacrificial gate dielectric layer 41, the sacrificial gate electrode layer 42 (e.g., poly silicon), the pad SiN layer 43 and the silicon oxide mask layer 44. By patterning the sacrificial gate structure, the stacked layers of the first and second semiconductor layers are partially exposed on opposite sides of the sacrificial gate structure, thereby defining source/drain (S/D) regions. In this disclosure, a source and a drain are interchangeably used and the structures thereof are substantially the same. In FIG. 8, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 9:
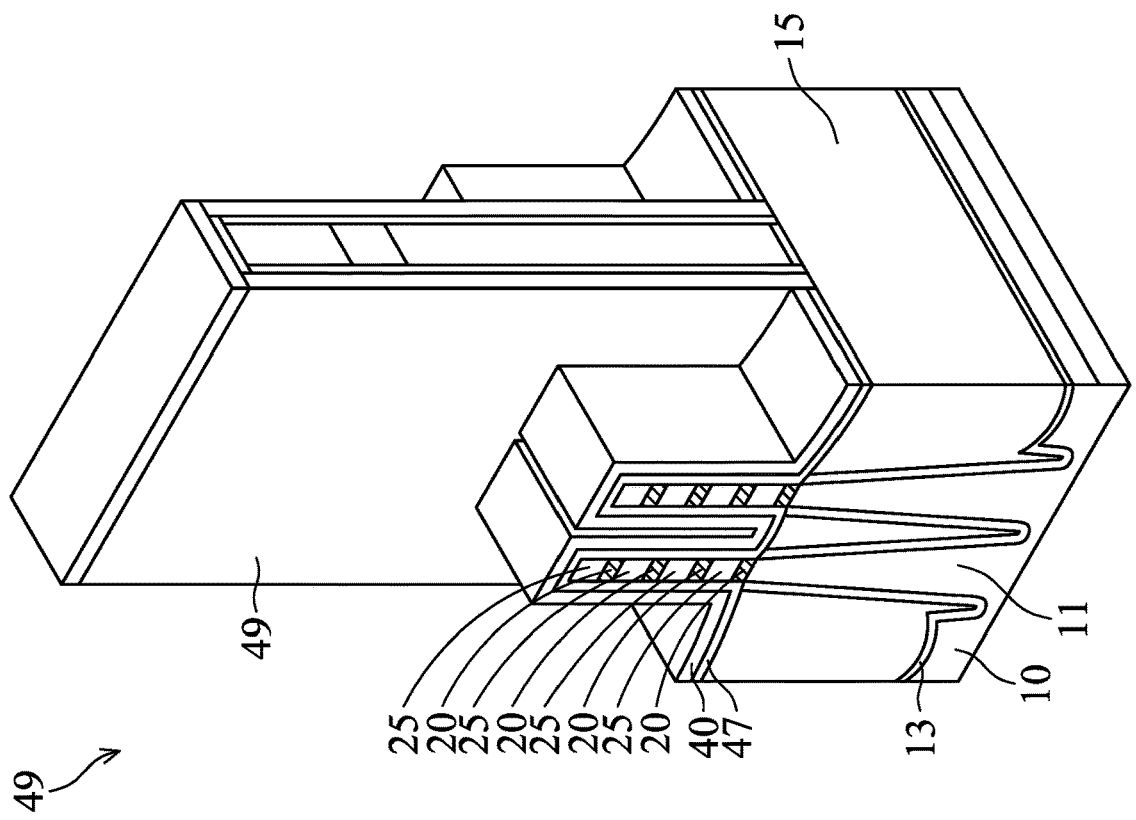

Referring to FIG. 9, at operation 112, the method 100 (FIG. 3A) forms gate sidewall spacers. In some embodiments, a cover layer 40 for sidewall spacers is formed over the sacrificial gate structure 49. The cover layer 40 is deposited in a conformal manner so that it is formed to have substantially equal thicknesses on vertical surfaces, such as the sidewalls, horizontal surfaces, and the top of the sacrificial gate structure, respectively. In some embodiments, the cover layer 40 has a thickness greater than the first cover layer and has the thickness in a range from about 5 nm to about 20 nm. The cover layer 40 includes one or more of SiN, SiON and SiCN or any other suitable dielectric material. The cover layer 40 can be formed by ALD or CVD, or any other suitable method.

In certain embodiments, before the cover layer 40 is formed, an additional cover layer 47 made of an insulating material is conformally formed over the exposed fin structures and the sacrificial gate structure 49. In such a case, the additional cover layer and the cover layer are made of different materials so that one of them can be selectively etched. The additional cover layer 47 includes a low-k dielectric material, such as SiOC and/or SiOCN or any other suitable dielectric material and can be formed by ALD or CVD, or any other suitable method.

By the operations explained with FIGS. 4-9, the structure of FIGS. 10A-10D can be obtained. In FIGS. 10A-10D, the upper portion of the sacrificial gate structure is not shown.

Next, referring to FIGS. 11A-11D, at operation 114, the method 100 (FIG. 3A) etches the stacked structure of the first semiconductor layers 20 and the second semiconductor layer 25 down at the S/D region, by using one or more lithography and etching operations, thereby forming an S/D space 27. In some embodiments, the substrate 10 (or the bottom part of the fin structures 11) is also partially etched.

Referring to FIGS. 12A-12D, at operation 116, the method 100 (FIG. 3A) laterally etches the first semiconductor layers 20 in the X direction through the S/D space 27, thereby forming cavities (or recesses) 22. The amount of etching of the first semiconductor layer 20 is in a range from about 3 nm to about 10 nm in some embodiments. When the first semiconductor layers 20 are Ge or SiGe and the second semiconductor layers 25 are Si, the first semiconductor layers 20 can be selectively etched by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions.

In other embodiments, as shown in FIGS. 13A-13D, by selecting an appropriate crystal orientation of the first semiconductor layers 20 and an etchant, the etched surface of the lateral ends of the first semiconductor layers 20 has an octangle cavity 23 defined by (100) and (110) facets. In the cross section along the X direction, the cavity 23 has a trapezoid shape, as shown in FIG. 13A.

In yet other embodiments, as shown in FIGS. 14A-14D, by selecting an appropriate crystal orientation of the first semiconductor layers 20 and an etchant, the etched surface of the lateral ends of the first semiconductor layers 20 has a quadrilateral cavity 24 defined by (111) facets. In the cross section along the X direction, the cavity 24 has a V-shape (or an open-triangle shape), as shown in FIG. 7A.

In the following figures, the manufacturing operations after the structure shown in FIGS. 12A-12D is formed are explained. However, the same operations can be applied to the structure shown in FIGS. 13A-13D and the structure shown in FIGS. 14A-14D.

Referring to FIGS. 15A-15D, at operation 118, the method 100 (FIG. 3A) deposits the first insulating layer 33 on the lateral ends of the first semiconductor layer 20 and on the second semiconductor layer 25 in the S/D space 27. In the illustrated embodiment, the first insulating layer 33 is conformally formed. The term "conformally" may be used herein for ease of description upon a layer having substantial same thickness over various regions. The first insulating layer 33 can be formed by ALD or any other suitable method. By conformally forming the first insulating layer 33, the size of cavity 22 is reduced.

Referring to FIGS. 16A-16D, at operation 120, the method 100 (FIG. 3A) performs an etching operation to partially remove the first insulating layer 33 from outside of the cavity 22. By this etching, the first insulating layer 33 remains substantially within the cavity 22, because of a small volume of the cavity. Particularly, the first insulating layer 33 remains on exposed vertical sidewalls of the first semiconductor layer 20 and is removed from parts of the lateral ends of the second semiconductor layer 25. Generally, plasma dry etching etches a layer in wide and flat areas faster than a layer in concave (e.g., holes, grooves and/or slits) portions. Thus, the first insulating layer 33 can remain inside the cavities 22. In a particular example, a dry etching process with an etchant concentration larger than 30% is used with proper etching time to remove the first insulating layer 33 from outside the cavity 22 and from lateral ends of the second semiconductor layer 25 inside the cavity 22.

Referring to FIGS. 17A-17D, at operation 122, the method 100 (FIG. 3B) deposits the second insulating layer 35 on the lateral ends of the first semiconductor layer 20 and on the second semiconductor layer 25 in the S/D space 27. Particularly, the second insulating layer 35 abuts the first insulating layer 33 in the cavity 22. In the illustrated embodiment, the second insulating layer 35 is conformally formed. The second insulating layer 35 can be formed by ALD or any other suitable method. By conformally forming the second insulating layer 35, the size of cavity 22 is further reduced or completely filled.

Referring to FIGS. 18A-18D, at operation 124, the method 100 (FIG. 3B) performs an etching operation to partially remove the second insulating layer 35 from outside of the cavity 22. By this etching, the second insulating layer 35 remains substantially within the cavity, because of a small volume of the cavity. Particularly, the first insulating layer 33 remains wrapping parts of the lateral ends of the second semiconductor layer 25. In furtherance of some embodiments, end portions (edges) of the second insulating layer 35 under the gate sidewall spacer 40 are substantially flush with the end portions (edges) of the second semiconductor layer 25. Here, "substantially flush" means the difference in the relative position is less than about 1 nm. Generally, plasma dry etching etches a layer in wide and flat areas faster than a layer in concave (e.g., holes, grooves and/or slits) portions. Thus, the second insulating layer 35 can remain inside the cavities 22. In a particular example, a dry etching process with an etchant concentration less than 30% is used with proper etching time to remove the second insulating layer 35 from outside the cavity 22.

Subsequently, referring to FIGS. 19A-19D, at operation 130, the method 100 (FIG. 3B) forms an S/D epitaxial layer 50 in the S/D space 27. The source/drain epitaxial layer 50 includes one or more layers of Si, SiP, SiC and SiCP for an n-channel FET or Si, SiGe, Ge for a p-channel FET. For the P-channel FET, boron (B) may also be contained in the source/drain. The source/drain epitaxial layer 50 is formed by an epitaxial growth method using CVD, ALD or molecular beam epitaxy (MBE). As shown in FIGS. 19A-19D, the source/drain epitaxial layer 50 is formed in contact with the second semiconductor layers 25 and the second insulating layer 35.

Referring to FIGS. 20A-20D, in some embodiments, in the cases that the conformally deposited second insulating layer 35 does not not filling up the cavity 22, the second insulating layer 35 has a U-shape (90 degree rotated) and air gaps 37 are formed between the S/D epitaxial layer 50 and the first insulating layer 33. The air gaps 37 reduces the overall effective dielectric constant of the inner spacers 31.

In some alternative embodiments, from operation 124, the method 100 may optionally proceed to form the third insulating layer 39 in the cavity 22, prior to the growing of the S/D epitaxial layer 50. The third insulating layer 39 protects the second insulating layer 35 from etching loss from the S/D side, such as an S/D space cleaning process. The forming of the third insulating layer 39 may include operation 126 (FIG. 3B), in which the third insulating layer 39 is conformally deposited in the S/D space 27 and fill the cavity 22. The forming of the third insulating layer 39 may further include operation 128 (FIG. 3B), in which the third insulating layer 39 is partially removed from outside of the cavity 22 in a plasma dry etching process. The method 100 then proceeds from operation 128 to operation 130. The alternative resultant structure after operation 130 is illustrated in FIGS. 21A-21D, Referring to FIGS. 22A-22D, at operation 132, the method 100 (FIG. 3B) forms an interlayer dielectric (ILD) layer 70 over the S/D epitaxial layer 50. The materials for the ILD layer 70 include compounds comprising Si, O, C and/or H, such as silicon oxide, SiCOH and SiOC. Organic materials, such as polymers, may be used for the ILD layer 70. After the ILD layer 70 is formed, a planarization operation, such as CMP, is performed, so that the top portion of the sacrificial gate electrode layer 42 is exposed.

Referring to FIGS. 23A-23D, at operation 134, the method 100 (FIG. 3B) removes the sacrificial gate electrode layer 42 and sacrificial gate dielectric layer 41. The ILD layer 70 protects the S/D epitaxial layer 50 during the removal of the sacrificial gate structures. The sacrificial gate structures can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

Still referring to FIGS. 23A-23D, at operation 136, the method 100 (FIG. 3B) removes the first semiconductor layers 20, thereby forming channel members (e.g., nanowires or nanosheet) of the second semiconductor layers 25. The first semiconductor layers 20 can be removed or etched using an etchant that can selectively etch the first semiconductor layers 20 against the second semiconductor layers 25, as set forth above. Since the first insulating layer 33 is formed, the etching of the first semiconductor layers 20 stops at the first insulating layer 33. In other words, the first insulating layer 33 functions as an etch-stop layer for etching of the second insulating layer 35.

Referring to FIGS. 24A-24D, at operation 138, the method 100 (FIG. 3B) forms a gate dielectric layer 82 wrapping around each channel member and a gate electrode layer 84 on the gate dielectric layer 82. In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include HfO2, HfSiO, HfSiON, HfTaO, HfTiO, HfZrO, zirconium oxide, aluminum oxide, titanium oxide, hafnium dioxide-alumina (HfO2-Al2O3) alloy, other suitable high-k dielectric materials, and/or combinations thereof. In some embodiments, the gate dielectric layer 82 includes an interfacial layer (not shown) formed between the channel layers and the dielectric material. The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layers. The thickness of the gate dielectric layer 82 is in a range from about 1 nm to about 6 nm in one embodiment.

The gate electrode layer 84 is formed on the gate dielectric layer 82 to surround each channel layer. The gate electrode 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 84 may be formed by CVD, ALD, electro-plating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed. In some embodiments, after the planarization operation, the gate electrode layer 84 is recessed and a cap insulating layer (not shown) is formed over the recessed gate electrode layer 84. The cap insulating layer includes one or more layers of a silicon nitride-based material, such as SiN. The cap insulating layer can be formed by depositing an insulating material followed by a planarization operation.

In certain embodiments of the present disclosure, one or more work function adjustment layers (not shown) are interposed between the gate dielectric layer 82 and the gate electrode 84. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Referring to FIGS. 25A-25D, the method 100 proceeds to form various features and regions known in the art. For example, contact holes are formed in the ILD layer 70 by using dry etching, thereby exposing the upper portion of the S/D epitaxial layer 50. In some embodiments, a silicide layer is formed over the S/D epitaxial layer 50. The silicide layer includes one or more of WSi, CoSi, NiSi, TiSi, MoSi and TaSi. Then, a conductive contact layer 72 is formed in the contact holes. The conductive contact layer 72 includes one or more of Co, Ni, W, Ti, Ta, Cu, Al, TiN and TaN. Further, a conductive contact plug 75 is formed on the conductive contact layer 72. The conductive contact plug 75 includes one or more layers of Co, Ni, W, Ti, Ta, Cu, Al, TiN and TaN. Subsequent processing may form multilayers interconnect features (e.g., metal layers and interlayer dielectrics) configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Although not intended to be limiting, one or more embodiments of the present disclosure provide many benefits to a semiconductor device and the formation thereof. For example, embodiments of the present disclosure provide inner spacers with multiple layers with at least a low-k dielectric layer and a capping layer as an etch stop layer. The capping layer makes it possible to more precisely control the thickness, the shape, and/or the locations of the inner spacers and thus to control capacitances around the source/drain and the gate. Furthermore, the inner spacer formation method can be easily integrated into existing semiconductor fabrication processes.

In one exemplary aspect, the present disclosure is directed to a method of manufacturing a semiconductor device. The method includes forming a fin structure in which first semiconductor layers and second semiconductor layers are alternatively stacked; forming a sacrificial gate structure over the fin structure; etching a source/drain (S/D) region of the fin structure, which is not covered by the sacrificial gate structure, thereby forming an S/D space; laterally etching the first semiconductor layers through the S/D space, thereby forming recesses; forming a first insulating layer, in the recesses, on the etched first semiconductor layers; after the first insulating layer is formed, forming a second insulating layer, in the recesses, on the first insulating layer, wherein a dielectric constant of the second insulating layer is less than that of the first insulating layer; and forming an S/D epitaxial layer in the S/D space, wherein the second insulating layer is in contact with the S/D epitaxial layer. In some embodiments, the first insulating layer has a carbon concentration higher than that of the second insulating layer. In some embodiments, the second insulating layer is substantially free of carbon. In some embodiments, the second insulating layer has an oxygen concentration higher than that of the first insulating layer. In some embodiments, the second insulating layer separates the first insulating layer from contacting the S/D epitaxial layer. In some embodiments, the method further includes after the second insulating layer is formed, forming a third insulating layer, in the recesses, on the second insulating layer. In some embodiments, the dielectric constant of the second insulating layer is less than that of the third insulating layer. In some embodiments, the first and third insulating layers have a same material composition. In some embodiments, the forming of the S/D epitaxial layers results in air gaps formed between the S/D epitaxial layer and the first and second insulating layers. In some embodiments, each of the air gaps is defined by the S/D epitaxial layer and the second insulating layer. In some embodiments, the method further includes removing the sacrificial gate structure, thereby exposing the fin structure; removing the first semiconductor layers from the exposed fin structure, thereby forming channel members including the second semiconductor layers; and forming a gate dielectric layer and a gate electrode layer around the channel members.

In another exemplary aspect, the present disclosure is directed to a method of fabricating a semiconductor device. The method includes a method of manufacturing a semiconductor device. The method includes forming a stack of a first type and a second type epitaxial layers on a semiconductor substrate, the first type and second type epitaxial layers having different material compositions and the first type and second type epitaxial layers being alternatingly disposed in a vertical direction; patterning the stack to form a fin structure; forming a sacrificial gate structure over the fin structure; removing at least the first type epitaxial layers from a source/drain (S/D) region of the fin structure, which is not covered by the sacrificial gate structure; forming a first insulating layer on lateral ends of the first type epitaxial layers, wherein the first insulating layer includes carbon-containing compound; forming a second insulating layer on the first insulating layer, wherein the second insulating layer includes oxide-containing compound; and forming an S/D epitaxial feature in contact with lateral ends of the second type epitaxial layers, wherein the first and second insulating layers interpose the S/D epitaxial feature and the first type epitaxial layers. In some embodiments, a dielectric constant of the second insulating layer is less than that of the first insulating layer. In some embodiments, the first insulating layer includes silicon carbon oxynitride and the second insulating layer includes silicon oxynitride. In some embodiments, the S/D epitaxial feature and the second insulating layer jointly define air gaps interposing the S/D epitaxial feature and the first type epitaxial layers. In some embodiments, the method further includes forming a third insulating layer different from the second insulating layer on the second insulating layer, prior to the forming of the epitaxial S/D feature. In some embodiments, the second insulating layer separates the third insulating layer from contacting the second type epitaxial layers.

In yet another exemplary aspect, the present disclosure is directed to a semiconductor device. The semiconductor device includes semiconductor channel members disposed over a substrate; a gate dielectric layer disposed on and wrapping around the semiconductor channel members; a gate electrode layer disposed on the gate dielectric layer and wrapping around the semiconductor channel members; a source/drain (S/D) epitaxial layer in contact with the semiconductor channel members; and a dielectric spacer interposing the S/D epitaxial layer and the gate dielectric layer, wherein each of the dielectric spacer includes a first dielectric layer in contact with the gate dielectric layer and a second dielectric layer in contact with the first dielectric layer, wherein the first dielectric layer has a dielectric constant higher than that of the second dielectric layer. In some embodiments, the dielectric spacer further includes a third dielectric layer in contact with the S/D epitaxial layer. In some embodiments, the semiconductor device further includes an airgap interposing the S/D epitaxial layer and the dielectric spacer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure in which first semiconductor layers and second semiconductor layers are alternatingly stacked;
    forming a sacrificial gate structure over the fin structure;
    etching a source/drain (S/D) region of the fin structure, which is not covered by the sacrificial gate structure, thereby forming an S/D space;
    laterally etching the first semiconductor layers through the S/D space, thereby forming recesses;
    forming a first insulating layer, in the recesses, on the etched first semiconductor layers;
    after the first insulating layer is formed, forming a second insulating layer, in the recesses, on the first insulating layer, wherein a dielectric constant of the second insulating layer is less than that of the first insulating layer; and
    after the second insulating layer is formed, forming an S/D epitaxial layer in the S/D space, wherein the second insulating layer is in contact with the S/D epitaxial layer, and wherein the second insulating layer separates the first insulating layer from physically contacting the S/D epitaxial layer.

2. The method of claim 1, wherein the first insulating layer has a carbon concentration higher than that of the second insulating layer.

3. The method of claim 2, wherein the second insulating layer is substantially free of carbon.

4. The method of claim 1, wherein the second insulating layer has an oxygen concentration higher than that of the first insulating layer.

5. The method of claim 1, further comprising:
    after the second insulating layer is formed, forming a third insulating layer, in the recesses, on the second insulating layer.

6. The method of claim 5, wherein the dielectric constant of the second insulating layer is less than that of the third insulating layer.

7. The method of claim 5, wherein the first and third insulating layers have a same material composition.

8. The method of claim 1, wherein the forming of the S/D epitaxial layers results in air gaps formed between the S/D epitaxial layer and the first and second insulating layers.

9. The method of claim 8, wherein each of the air gaps is defined by the S/D epitaxial layer and the second insulating layer.

10. The method of claim 1, further comprising:
removing the sacrificial gate structure, thereby exposing the fin structure, removing the first semiconductor layers from the exposed fin structure, thereby forming channel members including the second semiconductor layers; and
forming a gate dielectric layer and a gate electrode layer around the channel members.

11. A method of manufacturing a semiconductor device, comprising:
forming a stack of a first type and a second type epitaxial layers on a semiconductor substrate, the first type and second type epitaxial layers having different material compositions and the first type and second type epitaxial layers being alternatingly disposed in a vertical direction;
patterning the stack to form a fin structure;
forming a sacrificial gate structure over the fin structure;
removing at least the first type epitaxial layers from a source/drain (S/D) region of the fin structure, which is not covered by the sacrificial gate structure;
forming a first insulating layer on lateral ends of the first type epitaxial layers, wherein the first insulating layer includes carbon-containing compound;
forming a second insulating layer on the first insulating layer, wherein the second insulating layer includes oxide-containing compound;
after the second insulating layer is formed, forming an S/D epitaxial feature in contact with lateral ends of the second type epitaxial layers;
forming an S/D contact over the S/D epitaxial feature; and
forming a multilayer interconnection over the S/D contact, wherein the first and second insulating layers interpose the S/D epitaxial feature and the first type epitaxial layers, and
wherein the second insulating layer separates the first insulating layer from physically contacting the S/D epitaxial layer.

12. The method of claim 11, wherein a dielectric constant of the second insulating layer is less than that of the first insulating layer.

13. The method of claim 11, wherein the first insulating layer includes silicon carbon oxynitride and the second insulating layer includes silicon oxynitride.

14. The method of claim 11, wherein the S/D epitaxial feature and the second insulating layer jointly define air gaps interposing the S/D epitaxial feature and the first type epitaxial layers.

15. The method of claim 11, further comprising:
forming a third insulating layer different from the second insulating layer on the second insulating layer, prior to the forming of the epitaxial S/D feature.

16. The method of claim 15, wherein the second insulating layer separates the third insulating layer from contacting the second type epitaxial layers.

17. A method, comprising:
forming a stack of a first type and a second type epitaxial layers on a semiconductor substrate, the first type and second type epitaxial layers having different material compositions and the first type and second type epitaxial layers being alternatingly disposed in a vertical direction;
patterning the stack to form a fin-shape structure;
forming a sacrificial gate structure over the fin-shape structure;
etching the fin-shape structure in a region adjacent to the sacrificial gate structure to form a recess;
laterally etching the first type epitaxial layers from the recess;
depositing a first insulating layer on lateral ends of the first type epitaxial layers;
depositing a second insulating layer on the first insulating layer, wherein material compositions of the first and second insulating layers are different;
depositing a third insulating layer on the second insulating layer, wherein material compositions of the second and third insulating layers are different, and wherein the first and third insulating layers have a same material composition;
forming an epitaxial feature in the recess and in contact with lateral ends of the second type epitaxial layers, wherein the first, second, and third insulating layers interpose the epitaxial feature and the first type epitaxial layers;
completely removing the first type epitaxial layers to release the second type epitaxial layers; and
replacing the sacrificial gate structure with a metal gate structure.

18. The method of claim 17, wherein each of the first, second, and third insulating layers is in contact with the epitaxial feature.

19. The method of claim 17, wherein each of the second and third insulating layers is in contact with the epitaxial feature, and the first insulating layer is separated from the epitaxial feature by the second and third insulating layers.

20. The method of claim 1, wherein the lateral etching of the first semiconductor layers exposes (100) and (110) facets of the first semiconductor layers.

* * * * *